(12) United States Patent
Yamada et al.

(10) Patent No.: US 8,432,087 B2
(45) Date of Patent: Apr. 30, 2013

(54) RESONATOR ELEMENT, RESONATOR, OSCILLATOR, AND ELECTRONIC DEVICE

(75) Inventors: Akinori Yamada, Ina (JP); Makoto Furuhata, Matsumoto (JP)

(73) Assignee: Seiko Epson Corporation (JP)

( * ) Notice: Subject to any disclaimer, the term of this patent is extended or adjusted under 35 U.S.C. 154(b) by 418 days.

(21) Appl. No.: 12/878,629

(22) Filed: Sep. 9, 2010

(65) Prior Publication Data

US 2011/0063041 A1  Mar. 17, 2011

(30) Foreign Application Priority Data

Sep. 11, 2009 (JP) ................................. 2009-210156
Jul. 8, 2010 (JP) ................................. 2010-155488

(51) Int. Cl.
*H03H 9/19* (2006.01)
*H03H 9/21* (2006.01)

(52) U.S. Cl.
USPC ....................................................... 310/370

(58) Field of Classification Search ................... 310/370
See application file for complete search history.

(56) References Cited

U.S. PATENT DOCUMENTS

| | | | |
|---|---|---|---|
| 6,587,009 B2 | 7/2003 | Kitamura et al. | |
| 7,626,318 B2 * | 12/2009 | Dalla Piazza et al. | 310/370 |
| 8,134,284 B2 * | 3/2012 | Kawanishi | 310/370 |
| 2010/0156237 A1 * | 6/2010 | Ichikawa et al. | 310/312 |
| 2011/0043079 A1 * | 2/2011 | Shirai et al. | 310/365 |

(Continued)

FOREIGN PATENT DOCUMENTS

| | | |
|---|---|---|
| JP | 02-032229 | 2/1990 |
| JP | 2002-261575 | 9/2002 |

(Continued)

OTHER PUBLICATIONS

C. Zener et al., "Internal Friction in Solids I. Theory of Internal Friction in Reeds", Physical Preview, vol. 52, pp. 230-235 (Aug. 1, 1937).
C. Zener et al., "Internal Friction in Solids II. General Theory of Thermoelastic Internal Friction", Physical Preview, vol. 53, pp. 90-99 (Jan. 1, 1938).

(Continued)

*Primary Examiner* — J. San Martin
(74) *Attorney, Agent, or Firm* — Harness, Dickey & Pierce, P.L.C.

(57) ABSTRACT

A resonator element includes: a base portion; and a resonating arm extending in a first direction from the base portion, wherein the resonating arm includes a first surface, a second surface facing the first surface, a first side surface extending in the first direction so as to connect the first and second surfaces, and a second side surface facing the first side surface, wherein the resonating arm includes a first width portion having a first width and a second width portion provided at a root of the resonating arm so as to have a second width larger than the first width, wherein the resonating arm includes a groove portion provided on at least one of the first and second surfaces so as to extend in the first direction, the groove portion in the second width portion having a width larger than a width of the groove portion in the first width portion, and wherein a sum of the width between the groove portion in the second width portion and the first side surface and the width between the groove portion in the second width portion and the second side surface is smaller than a sum of the width between the groove portion in the first width portion and the first side surface and the width between the groove portion in the first width portion and the second side surface.

8 Claims, 10 Drawing Sheets

U.S. PATENT DOCUMENTS

| | | | | |
|---|---|---|---|---|
| 2011/0227452 A1* | 9/2011 | Yamada | | 310/323.01 |
| 2011/0227672 A1* | 9/2011 | Yamada | | 333/200 |
| 2011/0248600 A1* | 10/2011 | Yamada | | 310/300 |
| 2012/0039153 A1* | 2/2012 | Kobayashi | | 368/159 |
| 2012/0223784 A1* | 9/2012 | Tanaya | | 331/158 |

FOREIGN PATENT DOCUMENTS

| | | | |
|---|---|---|---|
| JP | 2004-260718 | | 9/2004 |
| JP | 2005-341251 | | 12/2005 |
| JP | 2011193316 A | * | 9/2011 |
| JP | 2011199330 A | * | 10/2011 |
| JP | 2011239133 A | * | 11/2011 |
| JP | 2012039509 A | * | 2/2012 |

OTHER PUBLICATIONS

C. Zener et al., "Internal Friction in Solids III. Experimental Demonstration of Thermoelastic Internal Friction", Physical Preview, vol. 53, pp. 100-101 (Jan. 1, 1938).

Hideaki Itoh et al., "Analysis of Q-Value of Quartz Crystal Tuning Fork Using Thermoelastic Coupling Equations", Japanese Journal of Applied Physics 48 (2009).

Hideaki Itoh et al., "Analysis of Q-Value of a Quartz-Crystal Tuning-Fork Using Thermoelastic Equations", 36th EM Symposium, pp. 5-8 (May 17, 2007) with English translation.

Terry V. Roszhart, "The Effect of Thermoelastic Internal Friction on the Q of Micromachined Silicon Resonators", Solid-State Sensor and Actuator Workshop, Technical Digest IEEE (Jan. 4, 1990).

* cited by examiner

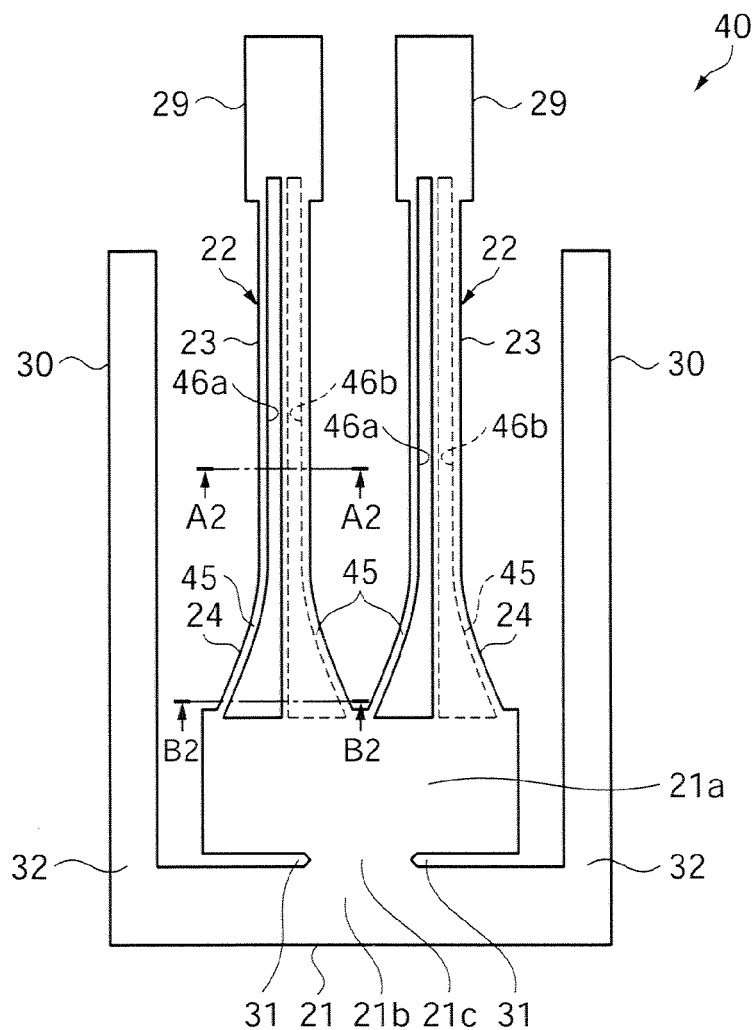
FIG. 2A
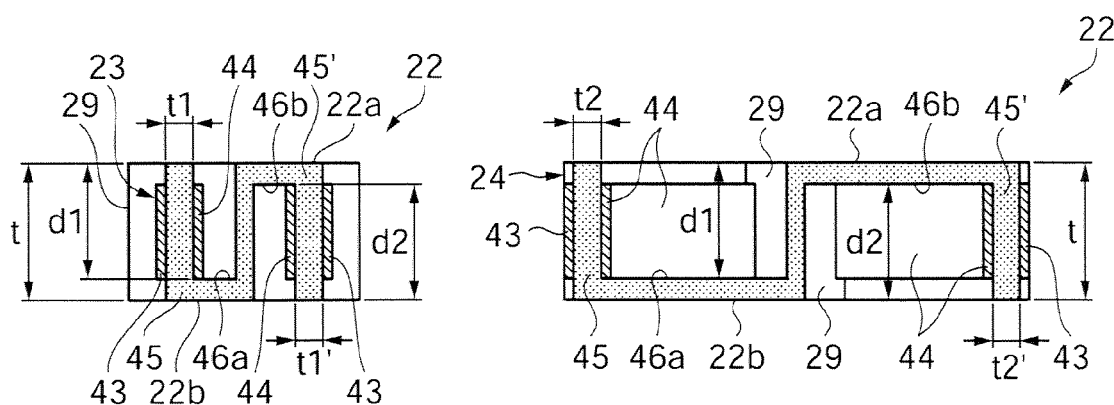
FIG. 2B
FIG. 2C

RESONATOR ELEMENT, RESONATOR, OSCILLATOR, AND ELECTRONIC DEVICE

BACKGROUND

1. Technical Field

The present invention relates to a resonator element that vibrates in a flexural vibration mode, for example, and a resonator, an oscillator, and an electronic device each having the resonator element.

2. Related Art

In the related art, as a resonator element that vibrates in a flexural vibration mode, a tuning-fork type flexural resonator element has been widely used, for example. The flexural resonator element has a configuration in which a pair of resonating arms extends in parallel from a base portion of a base member made from a piezoelectric material such as quartz crystal so as to vibrate in a direction close to or away from each other in a horizontal direction.

If a vibration energy loss occurs when the resonating arms of the tuning-fork type flexural resonator element vibrate, the vibration energy loss can cause degradation of performance of the resonator element such as an increase in CI (crystal impedance) value and a decrease in the Q value. Therefore, various attempts have been made to prevent or reduce such a vibration energy loss.

For example, JP-A-2002-261575 and JP-A-2004-260718 disclose a tuning-fork type quartz crystal resonator element in which slits or slit-grooves having a predetermined depth are formed at both side portions of a base portion from which resonating arms extend. In the tuning-fork type quartz crystal resonator element, even when the vibration of the resonating arms includes a vertical component, vibration leak from the base portion is suppressed by the slits or the slit-grooves. Thus, a vibration energy trapping effect increases, and the Q value of the resonator element is controlled and variation of the Q values among resonator elements is prevented.

Moreover, in the resonator element, the vibration energy loss occurs due to not only such a mechanical cause as described above, but also other causes such as heat conduction caused by a temperature difference between a contracted portion, which receives compressive stress, and an expanded portion, which receives tensile stress, of each of the resonating arms which perform flexural vibration. The decrease in the Q value due to the heat conduction is called a thermoelastic loss effect.

In order to prevent or suppress the decrease in the Q value due to the thermoelastic loss effect (hereinafter simply referred to as a thermoelastic loss, for example, JP-UM-A-2-32229 proposes a tuning-fork type resonator element in which a groove or a hole is formed on the central line of a resonating arm (resonating beam) having a rectangular cross-section.

According to JP-UM-A-2-32229, based on a relational equation between distortion and stress which is well known in the case of internal friction of solids generally caused by temperature differences, the thermoelastic loss can be described that, when the frequency in a resonator element resonating in the flexural vibration mode changes, the Q value becomes minimum at a relaxation frequency $fm=1/(2\pi\tau)$ (here, $\tau$ is a relaxation time).

The relationship between the Q value and the frequency is generally expressed as a curve F in FIG. 11. In this figure, a frequency at which the Q value becomes minimum $Q_0$ is a thermal relaxation frequency $f_0(=1/(2\pi\tau))$. That is, the thermal relaxation frequency $f_0$ is the same as the relaxation frequency fm (for example, see C. Zener and two others, "Internal Friction in Solids, III. Experimental Demonstration of Thermoelastic Internal Friction," PHYSICAL REVIEW, Volume 53, pp. 10-101 (Jan. 1, 1938)).

A tuning-fork type quartz crystal resonator element disclosed in JP-UM-A-2-32229 will be described in detail with reference to the drawings.

FIG. 10 is a plan view schematically showing a tuning-fork type quartz crystal resonator element as a typical example of a resonator element of the related art.

In FIG. 10, a tuning-fork type quartz crystal resonator element 1 of JP-UM-A-2-32229 includes two parallel resonating arms 3 and 4 extending from a base portion 2, and bottomed elongated grooves 6 and 7 having a straight-line shape are provided on the central line of each of the resonating arms 3 and 4. When a predetermined driving voltage is applied to excitation electrodes (not shown) of the tuning-fork type quartz crystal resonator element 1, the resonating arms 3 and 4 perform flexural vibration in a direction close to or away from each other as shown by imaginary lines (two-dot chain lines) and arrows in the figure.

By this flexural vibration, in the tuning-fork type quartz crystal resonator element 1, mechanical distortion occurs in a root portion of each of the resonating arms 3 and 4 attached to the base portion 2. That is, in the root portion of the resonating arm 3 attached to the base portion 2, a first region 10 which receives compressive or tensile stress due to the flexural vibration and a second region 11 which receives tensile stress when the first region 10 receives compressive stress while receiving compressive stress when the first region 10 receives tensile stress are present. The temperature of the first and second regions 10 and 11 increases when they receive compressive stress and decreases when they receive tensile stress.

Similarly, in the root portion of the resonating arm 4 attached to the base portion 2, a first region 12 which receives tensile or compressive stress due to the flexural vibration and a second region 13 which receives compressive stress when the first region 12 receives tensile stress while receiving tensile stress when the first region 12 receives compressive stress are present. The temperature of the first and second regions 12 and 13 increases when they receive compressive stress and decreases when they receive tensile stress.

By a temperature gradient taking place in this way, in the root portions of the resonating arms 3 and 4 attached to the base portion 2, heat conduction takes place between the first and second regions 10 and 11 and between the first and second regions 12 and 13. This temperature gradient takes place in a reverse direction so as to correspond to the flexural vibration of the resonating arms 3 and 4, and accordingly, the heat conduction also takes place in a reverse manner.

By this heat conduction, vibration energy of the resonating arms 3 and 4 is always partially lost as a thermoelastic loss during vibration. As a result, the Q value of the tuning-fork type quartz crystal resonator element 1 decreases and securing desired vibration properties is difficult.

In the tuning-fork type quartz crystal resonator element 1 of JP-UM-A-2-32229, since the transfer of heat from the contracted portion to the expanded portion is suppressed by the elongated grooves 6 and 7 provided on the central line of each of the resonating arms 3 and 4, it is possible to suppress or alleviate a decrease in the Q value due to a thermoelastic loss.

Meanwhile, in recent years, size-reduction techniques have been made in various products on which a vibration device having a resonator element is mounted, for example, small information apparatuses such as HDDs (hard disk drives), mobile computers, or IC cards, mobile communication apparatuses such as mobile phones, car-phones, or paging systems, and vibration gyro-sensors. With this trend, there is a further increasing demand for reducing the size of a vibration device (a resonator, an oscillator, and the like) mounted on these products and a resonator element accommodated in the vibration device.

For size-reduction of a resonator element, it is necessary to consider a problem in that mechanical strength will decrease if each part of the resonator element is made small or thin. Particularly, unless a predetermined level of rigidity is secured near a root portion of a resonating arm attached to a base portion where stress is concentrated when the resonator element vibrates, impact resistance against vibration stress and impact during dropping becomes insufficient. Thus, the resonator element may be destroyed.

As a resonator element which secures a predetermined level of such impact resistance, alleviates the mechanical or thermal vibration energy loss, and achieves size-reduction, for example, JP-A-2005-341251 discloses a resonator element in which the shape of an elongated groove formed in a resonating arm is innovated.

The resonator element (piezoelectric resonator element) disclosed in JP-A-2005-341251 includes a base portion made, for example, from quartz crystal, and a pair of resonating arms extending in parallel from the base portion. On the base portion, a pair of slits is formed in an opposing direction along one straight line so that a shrunken shape appears on both principal surfaces of the base portion.

Moreover, each resonating arm is provided with a bottomed elongated groove extending in a longitudinal direction of the resonating arm. The elongated groove is formed so that the groove width is small near a root portion of the resonating arm attached to the base portion and gradually increases as it goes towards the distal end of the resonating arm.

With this configuration, rigidity of the resonator element is strengthened in the elongated groove-formed regions of the root portions of the resonating arms attached to the base portion since the width of each bank portion formed between both side walls in the longitudinal direction of the elongated groove and both side surfaces of the resonating arm is larger as it goes towards the base portion rather than towards the distal end.

Accordingly, in the resonator element, it is possible to suppress the CI value with the elongated grooves and the slits while improving the impact resistance by strengthening the rigidity of the root portions of the resonating arms attached to the base portion. Moreover, it is possible to achieve size-reduction without degrading vibration properties while suppressing a decrease in the Q value.

However, in the resonator element disclosed in JP-A-2005-341251, since the elongated groove provided in the resonating arm has a shape such that the width gradually decreases from the distal end of the resonating arm to the base portion, the width of the bank portion formed in the longitudinal direction of the resonating arm increases near the root portion of the resonating arm attached to the base portion.

Due to this, in the resonator element, the thickness of a material serving as a heat conduction path for the transfer of heat from the contracted portion (high temperature portion) to the expanded portion (low temperature portion) during vibration of the resonating arm increases. Thus, a heat conduction time decreases and thermal relaxation is accelerated. Therefore, there is a problem in that the thermoelastic loss increases, the Q value decreases, and the vibration properties are degraded.

SUMMARY

An advantage of some aspects of the invention is to solve at least a part of the above problems and the invention can be embodied as the following forms or application examples.

Application Example 1

According to this application example, there is provided a resonator element including: a base portion; and a resonating arm extending from the base portion, in which: the resonating arm includes both principal surfaces of the resonating arm and both side surfaces connecting both principal surfaces and extending in a longitudinal direction of the resonating arm; the resonating arm further includes a small width portion, a large width portion of which the width between both side surfaces gradually increases from the small width portion to the base portion and becomes largest at a root portion attached to the base portion, and a bottomed elongated groove provided along the longitudinal direction of the resonating arm so as to have an opening on at least one of both principal surfaces; and a width of the opening of the elongated groove in the large width portion gradually increases from a distal end of the resonating arm to the base portion.

According to this configuration, the resonating arm of the resonator element is provided with the large width portion of which the width gradually increases towards the base portion and the bottomed elongated groove which extends along the large width portion and of which the width gradually increases towards the base portion.

With this configuration, in the resonator element, the thickness of a material serving as a heat conduction path is decreased compared with a case in which the resonator element has a structure in which the elongated groove is provided with the same width while extending from the small width portion to the base portion and a structure without the elongated groove. Therefore, the heat conduction path from a contracted portion (high temperature portion) to an expanded portion (low temperature portion) during vibration increases by being bypassed around the elongated groove. As a result, the heat conduction time increases.

Accordingly, the resonator element has improved impact resistance since the rigidity near the root portion of the resonating arm attached to the base portion is increased by the large width portion. Moreover, a thermoelastic loss is suppressed, a decrease in the Q value is suppressed, and excellent vibration properties can be provided.

According to another measure, there is provided a resonator element including: a base portion; and a resonating arm extending in a first direction from the base portion, in which the resonating arm includes a first surface, a second surface facing the first surface, a first side surface extending in the first direction so as to connect the first and second surfaces, and a second side surface facing the first side surface; the resonating arm includes a first width portion having a first width and a second width portion provided at a root of the resonating arm so as to have a second width larger than the first width; the resonating arm includes a groove portion provided at least one of the first and second surfaces so as to extend in the first direction, the groove portion in the second width portion having a width larger than the width of the groove portion in the first width portion; and a sum of the width between the groove portion in the second width portion and the first side surface and the width between the groove portion in the second width portion and the second side surface is smaller than a sum of the width between the groove portion in the first width portion and the first side surface and the width between the groove portion in the first width portion and the second side surface.

According to this configuration, the resonating arm of the resonator element includes the first width portion having the first width, the second width portion provided at the base portion side so as to have the second width, larger than the first width, and the groove portion provided at least one of the first and second surfaces so as to extend in the first direction.

Moreover, the width of the groove portion in the second width portion is larger than the width of the groove portion in the first width portion, and the sum of the width between the groove portion in the second width portion and the first side surface and the width between the groove portion in the second width portion and the second side surface is smaller than the sum of the width between the groove portion in the first width portion and the first side surface and the width between the groove portion in the first width portion and the second side surface.

With this configuration, in the resonator element, the thickness of a material serving as a heat conduction path is decreased compared with the structure of the related art. Therefore, the heat conduction path from a contracted portion (high temperature portion) to an expanded portion (low temperature portion) during vibration increases by being bypassed around the elongated groove. As a result, the heat conduction time increases.

Accordingly, the resonator element has improved impact resistance since the rigidity near the root portion (root) of the resonating arm attached to the base portion is increased by the second width portion. Moreover, a thermoelastic loss is suppressed, a decrease in the Q value is suppressed, and excellent vibration properties can be provided.

Application Example 2

According to this application example, in the resonator element of the above-mentioned application example, a plurality of the groove portions may be provided in at least one of the first and second surfaces.

According to this configuration, in the resonator element, since the heat conduction path is increased by the plurality of groove portions provided in at least one of the first and second surfaces, a decrease in the Q value due to a thermoelastic effect is suppressed.

In addition, since the resonator element is provided with the plurality of groove portions in at least one of the first and second surfaces rather than providing groove portions which each have one opening on each of the first and second surfaces of the resonating arm, bank portions (wall portions between the groove portions) formed at the center of the one surface function as a rib. Therefore, even when the width of each of the bank portions (wall portions between the groove portion and each side surface) on both side surfaces (the first and second side surfaces) of the resonating arm is small, it is possible to provide sufficient rigidity of the resonating arm.

Application Example 3

According to this application example, there is provided a resonator element including: a base portion; and a resonating arm extending in a first direction from the base portion, in which: the resonating arm includes a first surface, a second surface facing the first surface, a first side surface extending in the first direction so as to connect the first and second surfaces, and a second side surface facing the first side surface; the resonating arm includes a first width portion having a first width and a second width portion provided at a root of the resonating arm so as to have a second width larger than the first width; the resonating arm includes a first groove portion provided on the first surface and a second groove portion provided on the second surface, the first and second groove portions extending in the first direction; the first and second groove portions are arranged in a direction orthogonal to the first direction in a plan view from a normal direction to the first surface; a first depth of the first groove portion and a second depth of the second groove portion each are smaller than a distance in the normal direction between the first surface and the second surface, and a sum of the first and second depths is larger than the distance; and a width of the first groove portion in the second width portion is larger than a width of the first groove portion in the first width portion, or a width of the second groove portion in the second width portion is larger than a width of the second groove portion in the first width portion.

According to this configuration, since a cross-section of the resonating arm of the resonator element exhibits approximately an S-shape, a heat conduction path having a long heat bypassing distance is formed. Accordingly, the resonator element has improved impact resistance since the rigidity near the root portion (root) of the resonating arm attached to the base portion is increased by the second width portion. Moreover, since a thermal relaxation time τ is increased further, the Q value is improved remarkably, and excellent vibration properties can be provided.

Application Example 4

According to this application example, in the resonator element of the above-mentioned application example 3, the first groove portion may be on the first side surface, and the second groove portion may be on the second side surface, and a sum of the width between the first groove portion in the second width portion and the first side surface and the width between the second groove portion in the second width portion and the second side surface may be smaller than a sum of the width between the first groove portion in the first width portion and the first side surface and the width between the second groove portion in the first width portion and the second side surface.

According to this configuration, in the resonator element, since the thickness of a bank portion (wall portion between each groove portion and a side surface close to each groove portion) of the second width portion of the resonating arm is smaller than a bank portion of the first width portion, a thermal relaxation time τ is increased further. Therefore, a decrease in the Q value is suppressed, and excellent vibration properties can be provided.

Application Example 5

According to this application example, in the resonator element of the above-mentioned application example 3 or 4, a plurality of the first or second groove portions may be provided in at least one of the first and second surfaces.

According to this configuration, in the resonator element, since the resonating arm is thinner, and the cross-section of the resonating arm exhibits an M-shape (W-shape), a heat conduction path having a long heat bypassing distance is formed.

Accordingly, in the resonator element, the Q value is improved remarkably, and excellent vibration properties can be provided.

Application Example 6

According to this application example, in the resonator element of the above-mentioned application example, a weight portion having a larger width than the small width portion may be formed at a distal end of the resonating arm.

According to this configuration, since the weight portion having a larger width than the small width portion formed at a distal end of the vibration arm performs the function of a weight, the resonator element can decrease the frequency without increasing the length of the resonating arm.

According to another measure, the resonator element may be provided with a weight portion at a distal end of the resonating arm.

According to this configuration, since the weight portion at the distal end of the resonating arm performs the function of a weight, the resonator element can decrease the frequency without increasing the length of the resonating arm.

Application Example 7

According to this application example, in the resonator element of the above-mentioned application example 6, the width of a root portion of the resonating arm attached to the base portion is larger than the width of the weight portion.

According to this configuration, since the resonator element has strong rigidity near the root portion of the resonating arm attached to the base portion, it is possible to suppress a high-frequency vibration of the resonator element while suppressing degradation of impact resistance or the like of the resonating arm due to presence of the weight portion and to achieve a low-frequency resonator element in the normal state.

Application Example 8

According to this application example, in the resonator element of the above-mentioned application example, a pair of the resonating arms may be provided so as to extend in parallel from the base portion, and a supporting arm may be provided so as to extend in parallel to the resonating arms from a portion of the base portion between the pair of resonating arms.

According to this configuration, the resonator element provides a thermoelastic loss suppressing effect provided by the characteristic shape of the elongated groove in the large width portion of the resonating arm. In addition to this, since the supporting arm is provided between the pair of resonating arms, it is possible to suppress a change in operation parameters of the resonator element caused by a disturbance of air between the resonating arms when the respective resonating arms vibrate, particularly when the respective resonating arms vibrate in a direction close to each other.

Moreover, in the resonator element, it is possible to obviate various inconveniences which occur when the resonator element is supported and fixed to a package or the like with the base portion used as a supporting portion. For example, the distal end of the resonator element is prevented from being inclined downward to make contact with a package or the like, and an abnormal operation or the like which can take place when an impact on a package is transmitted directly to the resonating arm through the base portion can be obviated. Therefore, stable vibration properties can be obtained.

According to another measure, in the resonator element, a pair of the resonating arms extending in a line from the base portion may be provided, and a supporting arm may be provided so as to extend from a portion of the base portion between the pair of resonating arms.

According to this configuration, similarly to the above configuration, in the resonator element, since the supporting arm is provided between the pair of resonating arms, it is possible to suppress a change in operation parameters of the resonator element caused by a disturbance of air between the resonating arms when the respective resonating arms vibrate.

In addition, in the resonator element, since the supporting arms are supported and fixed to a package or the like, it is possible to prevent the distal ends of the resonating arms from making contact with a package, relieve an impact from the package, and obtain stable vibration properties.

Application Example 9

According to this application example, the resonator element of the above-mentioned application example may be a quartz crystal resonator element formed from quartz crystal.

According to this configuration, the resonator element has high impact resistance due to the characteristics of quartz crystal. Moreover, a decrease in the Q value caused by a thermoelastic loss is suppressed, and excellent vibration properties can be provided.

Application Example 10

According to this application example, there is provided a resonator including the resonator element as set forth in any one of the above-mentioned application examples 1 through 9 and a package accommodating the resonator element.

According to this configuration, the resonator is able to provide a resonator exhibiting the advantageous effects as set forth in any one of the above-mentioned application examples 1 through 9.

Application Example 11

According to this application example, there is provided an oscillator including the resonator element as set forth in any one of the above-mentioned application examples 1 through 9 and an oscillation circuit connected to the resonator element.

According to this configuration, the oscillator is able to provide an oscillator exhibiting the advantageous effects as set forth in any one of the above-mentioned application examples 1 through 9.

Application Example 12

According to this application example, there is provided an electronic device in which the resonator element as set forth in any one of the above-mentioned application examples 1 through 9 is used.

According to this configuration, the electronic device is able to provide an electronic device exhibiting the advantageous effects as set forth in any one of the above-mentioned application examples 1 through 9.

BRIEF DESCRIPTION OF THE DRAWINGS

The invention will be described with reference to the accompanying drawings, wherein like numbers reference like elements.

FIG. 2A is a plan view on one principal surface side, schematically illustrating a first modification of a piezoelectric resonator element, FIG. 2B is an enlarged sectional view taken along the line A2-A2 in FIG. 2A, and FIG. 2C is an enlarged sectional view taken along the line B2-B2 in FIG. 2A.

DESCRIPTION OF EXEMPLARY EMBODIMENTS

Hereinafter, an embodiment of a resonator element according to the invention will be described with reference to the drawings.

Figure 1A:
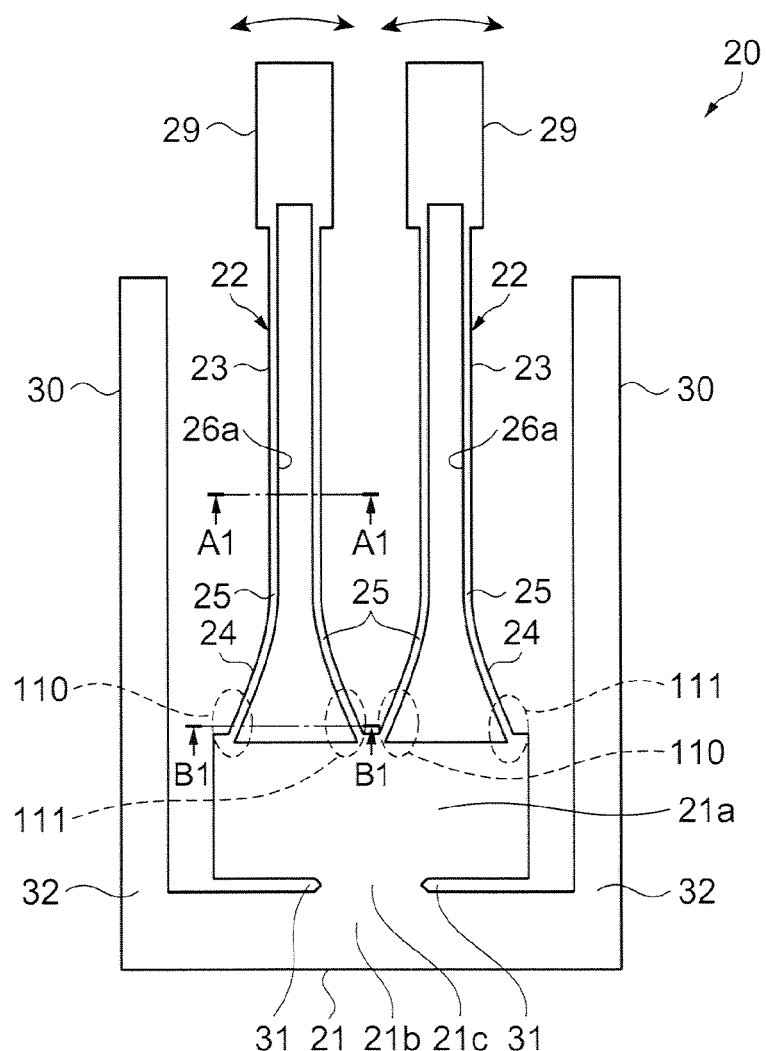
FIG. 1A is a plan view on one principal surface side, schematically illustrating an embodiment of a piezoelectric resonator element used as a resonator element.
Figure 1B:
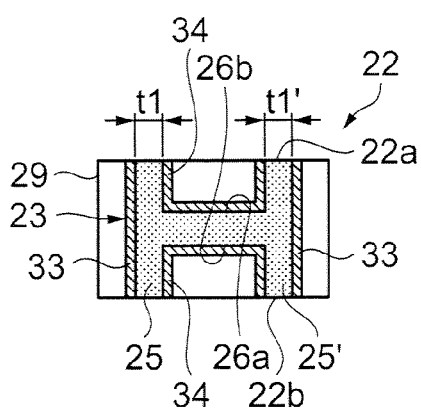
FIG. 1B is an enlarged sectional view taken along the line A1-A1 in FIG. 1A.
Figure 1C:
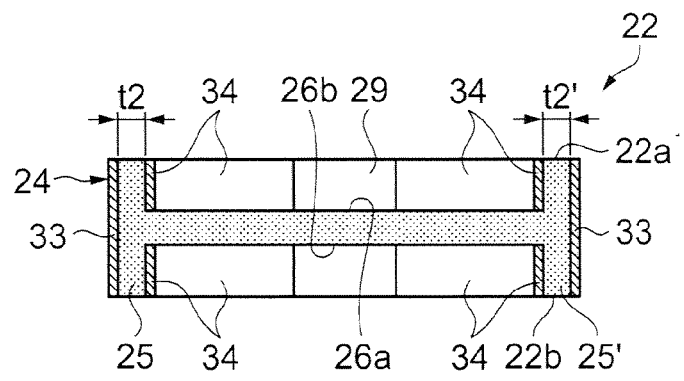
FIG. 1C is an enlarged sectional view taken along the line B1-B1 in FIG. 1A.

FIGS. 1A to 1C schematically illustrate a piezoelectric resonator element used as a resonator element of the embodiment of the invention, in which FIG. 1A is a plan view on one principal surface side, FIG. 1B is an enlarged sectional view taken along the line A1-A1 in FIG. 1A, and FIG. 1C is an enlarged sectional view taken along the line B1-B1 in FIG. 1A.

In FIG. 1A, a piezoelectric resonator element 20 is made from a piezoelectric material such as quartz crystal, lithium tantalate, or lithium niobate.

When the piezoelectric resonator element 20 is made from quartz crystal, a Z-cut quartz crystal plate is cut from a quartz crystal wafer by rotating the wafer clockwise in a range of 0° to 5° around a Z axis of an orthogonal coordinate system composed of X, Y, and Z axes, and the Z-cut quartz crystal plate is then cut and polished so as to have a predetermined thickness.

The piezoelectric resonator element 20 of this embodiment is formed so as to have the same appearance as a tuning-fork type resonator element including a base portion 21 formed by processing the Z-cut quartz crystal plate and a pair of resonating arms 22 separated into two stages from one end (upper end in the figure) of the base portion 21 so as to extend in parallel in a first direction.

On the base portion 21, a pair of slits 31 is formed in an opposing direction along one straight line so that a shrunken shape appears on both principal surfaces of the base portion 21. The base portion 21 includes a first portion 21a and a second portion 21b positioned on both sides with the pair of slits 31 interposed therebetween and a connecting portion 21c disposed between the pair of slits 31 so as to connect the first and second portions 21a and 21b.

In the piezoelectric resonator element 20 of this embodiment, since transmission of vibration of the respective resonating arms 22 is blocked by the slits 31, it is possible to suppress a vibration leak that vibration is transmitted to the outside through the base portion 21 and supporting arms 30 and prevent an increase in the CI value.

The respective slits 31 are preferably configured to have optimal width and length while securing strength against dropping of the piezoelectric resonator element 20 so as to minimize vibration leakage.

As shown in FIG. 1A, the pair of resonating arms 22 extends in parallel to both principal surfaces (front and rear surfaces of the drawing sheet) from the first portion 21a of the base portion 21. Moreover, each resonating arm 22 includes a first surface 22a which is one principal surface, a second surface 22b which is the other principal surface facing the first surface 22a, and both side surfaces (first and second side surfaces) that connect the first and second surfaces 22a and 22b and extend in the first direction.

Each resonating arm 22 includes a small width portion (first width portion) 23 which is positioned at a central portion thereof and which is a portion where a width (first width) of the resonating arm 22 between both side surfaces is relatively small. Moreover, each resonating arm 22 includes a large width portion (second width portion) 24 which is positioned in a root portion connected to the base portion 21, and of which a width (second width) between both side surfaces increases gradually from the small width portion 23 to the base portion 21 and becomes largest at the root portion attached to the base portion 21. Here, a relation of (second width)>(first width) is satisfied. Further, a weight portion 29 having a larger width than the small width portion 23 is formed at a distal end of each resonating arm 22.

As described above, since each resonating arm 22 is connected to the base portion 21 with a large width of the large width portion 24, the piezoelectric resonator element 20 has high rigidity and improved impact resistance or the like. Although FIGS. 1A to 1C show a case where the large width portion (second width portion) 24 has a shape such that the width thereof increases continuously and gradually, the large width portion (second width portion) 24 may have a shape (for example, a stair shape) such that the width thereof increases discontinuously.

Moreover, since each resonating arm 22 has the weight portion 29 at the distal end thereof, and the distal end portion performs the function of a weight, it is possible to decrease the frequency of the piezoelectric resonator element 20 without increasing the length of the resonating arm 22.

In this embodiment, each resonating arm 22 is formed so that the width (the width of the widest portion of the large width portion 24) of the root portion attached to the base portion 21 is larger than the width of the weight portion 29.

With this configuration, since the piezoelectric resonator element 20 has strong rigidity near the root portion of the resonating arm 22 attached to the base portion 21, it is possible to suppress a high-frequency vibration of the piezoelectric resonator element 20 while suppressing degradation of impact resistance or the like of the resonating arm 22 due to presence of the weight portion 29.

Moreover, in this embodiment, although the small width portion 23 of the resonating arm 22 has the same width along a predetermined length of the central portion of the resonating arm 22, the invention is not limited to this, and the small width portion 23 may be formed in a tapered shape.

For example, the piezoelectric resonator element 20 may have a configuration in which the small width portion 23 extending from the large width portion 24 of the resonating arm 22 is formed in a tapered shape such that the small width portion 23 gradually becomes narrow towards the distal end of the resonating arm 22 so that the resonating arm 22 can easily vibrate.

As shown in FIG. 1A, a pair of bottomed elongated grooves (groove portions) 26 is formed on the first surface 22a of each resonating arm 22 so as to extend along the longitudinal direction of the resonating arm 22. Moreover, as shown in FIG. 1B, a pair of bottomed elongated grooves (groove portions) 26b is formed on the second surface 22b of each resonating arm 22 so as to extend along the longitudinal direction of the resonating arm 22.

In the piezoelectric resonator element 20, since the rigidity thereof is decreased by the elongated grooves 26a and 26b formed on each resonating arm 22, it is possible to suppress an increase in frequency accompanied by size-reduction and realize size-reduction while maintaining a low frequency.

In addition, in the piezoelectric resonator element 20, there is an increased movement that suppresses the flow of heat resulting from an increase/decrease of temperature generated from bank portions (wall portions between the elongated grooves 26a and 26b and the side surfaces adjacent to the elongated grooves 26a and 26b) which are present on both side surfaces of the resonating arm 22. Therefore, it is possible to decrease a thermoelastic loss and improve the Q value.

In the resonating arm 22 of this embodiment, one ends of the elongated grooves 26a and 26b (disposed close to the distal end of the resonating arm 22) are formed at positions where they go beyond the boundary of the small width portion 23 and the weight portion 29 and enter into the weight portion 29.

By doing so, in the piezoelectric resonator element 20, since a region where a stress generated when the resonating arm 22 vibrates concentrates is distributed in the extending direction of the resonating arm 22, it is possible to obviate an inconvenience that stress concentrates on the root portion (the boundary of the small width portion 23 and the weight portion 29) of the resonating arm 22 attached to the weight portion 29 and results in a breakage.

To the contrary, the piezoelectric resonator element 20 can have the following advantageous effects by forming one ends of the elongated grooves 26a and 26b (disposed close to the distal end of the resonating arm 22) at positions closer to the base portion 21 than the boundary of the small width portion 23 and the weight portion 29.

That is, by causing a region where a stress generated when the resonating arm 22 vibrates concentrates to be distributed in the extending direction of the resonating arm 22, the piezoelectric resonator element 20 is able to obviate an inconvenience that stress concentrates on the root portion of the resonating arm 22 attached to the weight portion 29 and results in a breakage.

In addition, since a mass adding effect of the weight portion 29 in each resonating arm 22 increases, the piezoelectric resonator element 20 is able to decrease the frequency without increasing in size.

Moreover, when the piezoelectric resonator element 20 has a configuration, for example, in which a portion of the resonating arm 22 is formed in a tapered shape such that the width of the portion increases from the small width portion 23 to the weight portion 29 so as to prevent a breakage or the like due to stress concentration on the root portion of the resonating arm 22 attached to the weight portion 29, one ends of the elongated grooves 26a and 26b (disposed close to the distal end of the resonating arm 22) may be positioned at the boundary of the small width portion 23 and the weight portion 29.

Moreover, in each resonating arm 22, the elongated grooves 26a and 26b in the small width portion 23 are formed so as to exhibit a pair of straight-line shapes parallel to both side surfaces whereas the elongated grooves 26a and 26b in the large width portion 24 are formed so as to exhibit a shape such that they gradually widen towards both side surfaces as they go towards the root portion connected to the base portion 21 along both side surfaces of the large width portion 24.

With this configuration, the width of each of bank portions 25 disposed between the inner walls of the elongated grooves 26a and 26b of each resonating arm 22 and both side surfaces of the elongated grooves 26a and 26b is suppressed from widening near the root portion of the large width portions 24 attached to the base portion 21.

In this embodiment, the elongated grooves 26a and 26b are formed so that the sum of a width t2 of the bank portion 25 and a width t2' of the bank portion 25' of the large width portion 24 of the resonating arm 22 shown in FIG. 1C is smaller than the sum of a width t1 of the bank portion 25 and a width t1' of the bank portion 25' of the small width portion 23.

The piezoelectric resonator element 20 includes a pair of supporting arms 30 extending from the second portion 21b of the base portion 21. The pair of supporting arms 30 are formed so as to extend from the base portion 21 in opposite directions crossing the extending direction (first direction) of the pair of resonating arms 22 and are bent at bent portions 32 in the extending direction of the pair of resonating arms 22, so that they have an L-shape and an inverted L-shape, respectively.

Since the supporting arms 30 are bent in this manner, they are reduced in size while securing a supporting length. The supporting arms 30 are portions of the piezoelectric resonator element 20 attached to a package (not shown) or the like.

Since the piezoelectric resonator element 20 has the supporting arms 30 which are attached to a package or the like, the resonating arms 22 and the base portion 21 can suspend above a supporting surface of the package or the like.

The piezoelectric resonator element 20 has excitation electrodes 33 and 34 which are formed on the surfaces including the elongated grooves 26a and 26b and both side surfaces of each resonating arm 22 (see FIGS. 1B and 1C).

When a voltage is applied between the excitation electrodes 33 and 34 in one resonating arm 22 of the piezoelectric resonator element 20, both side surfaces of the resonating arm 22 are expanded and contracted, whereby the resonating arm 22 is vibrated.

The excitation electrodes 33 and 34 can be formed by etching quartz crystal to form an outer shape including the elongated grooves 26a and 26b of the piezoelectric resonator element 20, depositing an electrode layer, for example, of gold (Au) on a foundation layer, for example, of nickel (Ni) or chrome (Cr) by deposition or sputtering, and patterning the electrode layer using photolithography. It is known that chrome has high adhesion to quartz crystal and gold has low electrical resistance and is rarely oxidized.

Next, a thermoelectric loss suppressing effect during operation of the piezoelectric resonator element 20 of this embodiment will be described.

In FIG. 1A, when a driving voltage is applied to the excitation electrodes 33 and 34 (see FIG. 1B) from an oscillation circuit (not shown) used as an external excitation means connected to the piezoelectric resonator element 20, the resonating arms 22 vibrate in a direction close to or away from each other in a horizontal direction as shown by arrows in the figure. That is, the piezoelectric resonator element 20 of this embodiment vibrates in a flexural vibration mode.

By this flexural vibration, compressive stress and tensile stress are generated in the root portion of each resonating arm 22 attached to the base portion 21. Specifically, compressive stress and tensile stress are generated in a first region 110 and a second region 111 in the figure of each resonating arm 22.

More specifically, when the distal end of the left resonating arm 22 in the figure performs flexural vibration in a direction close to the right resonating arm 22 in the figure, the first region 110 of the left resonating arm 22 receives tensile stress and temperature thereof decreases, whereas the second region 111 receives compressive stress and temperature thereof increases.

On the contrary, when the distal end of the left resonating arm 22 in the figure performs flexural vibration in a direction away from the right resonating arm 22 in the figure, the first region 110 of the left resonating arm 22 receives compressive stress and temperature thereof increases, whereas the second region 111 receives tensile stress and temperature thereof decreases.

Similarly, when the right resonating arm 22 in the figure performs flexural vibration in a direction close to the left resonating arm 22 in the figure, the first region 110 of the right resonating arm 22 receives compressive stress and temperature thereof increases, whereas the second region 111 receives tensile stress and temperature thereof decreases.

On the contrary, when the distal end of the right resonating arm 22 in the figure performs flexural vibration in a direction away from the left resonating arm 22 in the figure, the first region 110 of the right resonating arm 22 receives tensile stress and temperature thereof decreases, whereas the second region 111 receives compressive stress and temperature thereof increases.

In this way, in the root portion of each resonating arm 22 attached to the base portion 21, a temperature gradient takes place between the portion which receives compressive stress and the portion which receives tensile stress, and a slope thereof is inverse to the resonating direction of each resonating arm 22.

In the piezoelectric resonator element 20, by this temperature gradient, heat conduction takes place in a direction from the contracted portion to the tensile (expanded) portion, namely from the high temperature portion to the low temperature portion.

In the piezoelectric resonator element 20 of this embodiment, since a lot of distortion, namely a temperature difference is generated near the root portion of the resonating arm 22 attached to the base portion 21, the heat conduction from the contracted portion to the expanded portion results in the flow of heat between portions serving as a heat conduction path of a piezoelectric material near the attached root portion.

When the contracted portion and the expanded portion are separated by a predetermined distance, the time for heat conduction from the contracted portion to the expanded portion decreases since a sufficient heat conduction path is secured as the thickness of a piezoelectric material remaining after the bottomed elongated grooves are formed increases.

The piezoelectric resonator element 20 of this embodiment is provided with the large width portion 24 of which the width between both side surfaces gradually increases from the small width portion 23 of each resonating arm 22 to the base portion 21 and the elongated grooves 26a and 26b having a shape such that they extend from the small width portions 23 along both side surfaces of the large width portions 24.

In addition, in this embodiment, the elongated grooves 26a and 26b are formed so that the sum of the width t2 of the bank portion 25 and the width t2' of the bank portion 25' of the large width portion 24 of the resonating arm 22 shown in FIG. 1C is smaller than the sum of the width t1 of the bank portion 25 and the width t1' of the bank portion 25' of the small width portion 23.

With this configuration, in the piezoelectric resonator element 20, the thickness of the piezoelectric material serving as the heat conduction path is decreased compared with cases where the piezoelectric resonator element 20 has a structure in which the elongated groove extends in a straight line from the small width portion 23 to the base portion 21 and a structure without the elongated groove, and where the thicknesses t1 (t1') and t2 (t2') are the same. Therefore, the heat conduction path from the contracted portion (high temperature portion) to the expanded portion (low temperature portion) increases by being bypassed around the elongated grooves 26a and 26b. As a result, the heat conduction time increases.

That is, in the piezoelectric resonator element 20, a relaxation time $\tau_1$ required for equalizing the temperature difference between the contracted portion and the expanded portion when the resonating arms 20 perform flexural vibration is longer than a relaxation time $\tau_0$ for the cases where the piezoelectric resonator element 20 has a structure in which the elongated groove extends in a straight line from the small width portion 23 to the base portion 21 and a structure without the elongated groove, and where the thicknesses t1 (t1') and t2 (t2') are the same.

Because of $\tau_1 > \tau_0$, when the piezoelectric resonator element 20 has a structure in which the elongated groove extends in a straight line from the small width portion 23 to the base portion 21 and a structure without the elongated groove, a thermal relaxation frequency $f_{10}=1/(2\pi\tau_1)$ of the piezoelectric resonator element 20 of this embodiment is lower than a thermal relaxation frequency $f_0=1/(2\pi\tau_0)$ of a piezoelectric resonator element when the thicknesses t1 (t1') and t2 (t2') are the same.

It is generally known that a relaxation vibration frequency (thermal relaxation frequency) $f_0$ is expressed by Expression (1).

$$f_0 = \pi k/(2\rho \cdot Cp \cdot a^2) \qquad (1)$$

In the expression, $\pi$ is the ratio of a circle's circumference to its diameter, k is a thermal conductivity in the vibration direction (flexural vibration direction) of a resonating arm, $\rho$ is a mass density of a resonating arm, Cp is a thermal capacity of a resonating arm, and a is the width in the vibration direction (flexural vibration direction) of a resonating arm.

A relaxation vibration frequency $f_0$ calculated when the constants of the material of the resonating arm are input to the thermal conductivity k, the mass density $\rho$, and the thermal capacity Cp of Expression (1) is a relaxation vibration frequency of the flexural vibration portion when the elongated grooves are not formed in the resonating arm.

Figure 11:
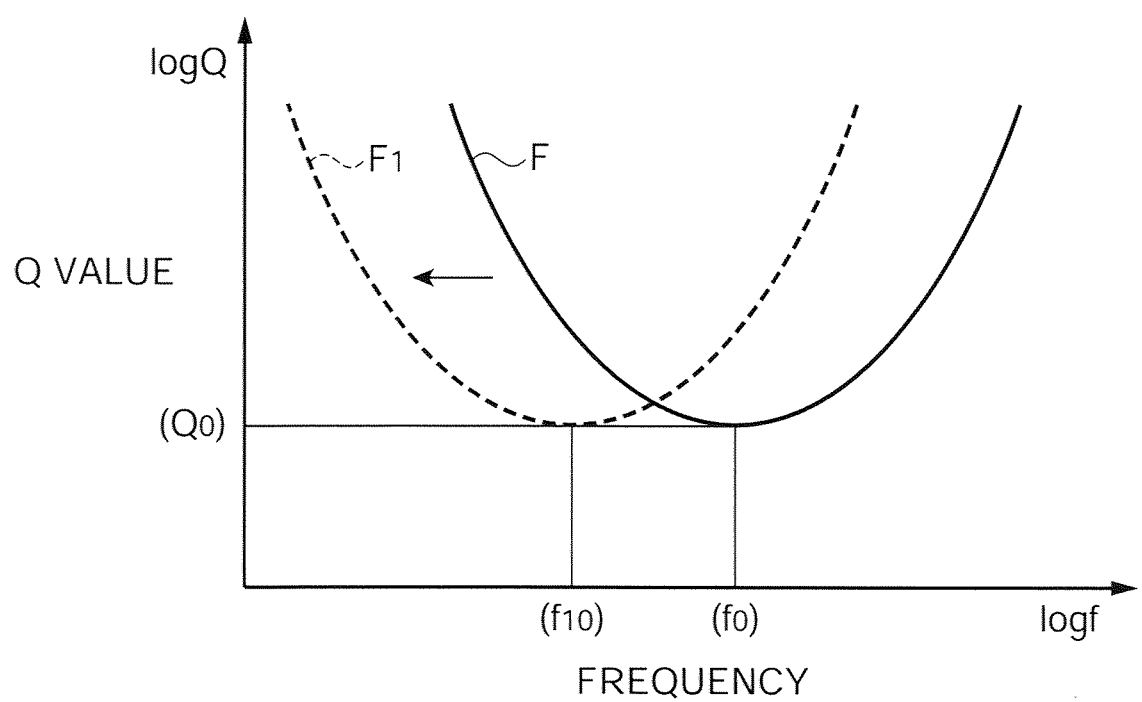
FIG. 11 is a graph showing the relationship between a relaxation frequency and a minimum Q value in a resonator element resonating in a flexural vibration mode.

When this is seen from the relationship between a mechanical vibration frequency (oscillation frequency) and the Q value of the resonating arm in FIG. 11, since the shape of a curve F itself is not changed, it can be considered that the curve F is shifted to a position of a curve F1 in the lower frequency direction with the decrease of the thermal relaxation frequency.

Accordingly, if the mechanical vibration frequency (oscillation frequency) of the resonating arm 22 is fr, in a range ($1 \leq \text{fr}/f_0$) of fr equal to or larger than the thermal relaxation frequency $f_0$, the Q value in the curve F1 is always higher than the Q value in the curve F.

In addition, in a frequency range ($1<\text{fr}/(f_0+(f_0 f_{10})^{1/2})$) higher than the frequencies at the intersections of the curves F and F1, the Q value in the curve F1 of the piezoelectric resonator element 20 is also higher than the Q value in the curve F.

As described above, the piezoelectric resonator element 20 of this embodiment has a structure in which the rigidity of the resonating arms 22 is increased by the large width portion 24 of each resonating arm 22, the elongated grooves 26a and 26b have a planar shape such that they extend along the large width portion 24, and the elongated grooves 26a and 26b are formed so that the sum of the width t2 of the bank portion 25 and the width t2' of the bank portion 25' of the large width portions 24 of the resonating arms 22 is smaller than the sum of the width t1 of the bank portion 25 and the width t1' of the bank portion 25' of the small width portions 23. Therefore, thermoelastic loss is suppressed, and a decrease in the Q value can be suppressed.

The piezoelectric resonator element used as the resonator element described in the above embodiment can be embodied as the following modification.

First Modification

The above embodiment has been described for the piezoelectric resonator element 20 having a configuration in which the bottomed elongated grooves 26a and 26b having the same shape are formed on the first and second surfaces 22a and 22b of each resonating arm 22 so that they are arranged at overlapping positions in plan view.

However, the invention is not limited to this, and the piezoelectric resonator element may have a configuration in which bottomed elongated grooves having openings respectively on the first and second surfaces 22a and 22b of each resonating arm are arranged in a line in plan view.

FIGS. 2A to 2C schematically illustrate a modification of a piezoelectric resonator element in which bottomed elongated grooves having openings on different surfaces are arranged in a line, in which FIG. 2A is a plan view on one principal surface side of the first surface, FIG. 2B is an enlarged sectional view taken along the line A2-A2 in FIG. 2A, and FIG. 2C is an enlarged sectional view taken along the line B2-B2 in FIG. 2A. In this modification, in FIGS. 2A to 2C, the same constituent elements as the above embodiment will be denoted by the same reference numerals, and description thereof will be omitted.

In FIG. 2A, a piezoelectric resonator element 40 includes a base portion 21 having a pair of slits 31 formed therein, a pair of resonating arms 22 extending in parallel in a first direction from one end of a first portion 21a of the base portion 21, and a pair of supporting arms 30 extending from a second portion 21b of the base portion 21.

Each resonating arm 22 includes a small width portion (first width portion) 23 which is positioned at a central portion thereof, a large width portion (second width portion) 24 of which the width between both side surfaces of the resonating arm 22 increases gradually from the small width portion 23 to the base portion 21, and a weight portion 29 which is positioned at the distal end of each resonating arm 22 and has a width larger than the small width portion 23.

On the first surface 22a of each resonating arm 22, a pair of first bottomed groove portions 46a is provided over an approximately half of the region in the longitudinal direction of each resonating arm 22. Moreover, on the second surface 22b of each resonating arm 22, a pair of second bottomed groove portions 46b is provided over a remaining approximately half of the region in the longitudinal direction of each resonating arm 22 (here, the remaining half of the region is different from the region where the first groove portion 46a is formed).

That is, on each resonating arm 22, the first groove portion 46a having an opening on the first surface 22a and the second groove portion 46b having an opening on the second surface 22b are arranged in a line in plan view.

Here, a first depth d1 of the first groove portion 46a and a second depth d2 of the second groove portion 46b are smaller than a distance t between the first and second surfaces 22a and 22b of each resonating arm 22. That is, the first and second groove portions 46a and 46b do not penetrate through the first and second surfaces 22a and 22b.

For example, in FIGS. 2A to 2C, the first depth d1 of the first groove portion 46a and the second depth d2 of the second groove portion 46b are both set to 0.9t. Here, as long as the first and second depths d1 and d2 are smaller than the distance t, and the sum of the first and second depths d1 and d2 is larger than the distance t, the first and second depths d1 and d2 are not limited to 0.9t. For example, a combination of d1=0.9t and d2=0.4t and a combination of d1=0.6t and d2=0.8t are also possible.

Since the first and second depths d1 and d2 are smaller than the distance t, the first and second groove portions 46a and 46b are configured as non-penetrating holes. Thus, it is possible to increase the rigidity of the respective resonating arms 22 compared to the case where the respective groove portions 46a and 46b are configured as penetration holes.

The first and second groove portions 46a and 46b are formed in the respective resonating arms 22 so as to have a shape such that they extend along their respective adjacent side surface. That is, the first groove portions 46a in the small width portions 23 are formed so as to exhibit a pair of straight-line shapes parallel to one side surface (the left side surface in the figure), whereas the first groove portions 46a in the large width portions 24 are formed so as to exhibit a shape such that they gradually widen towards both side surfaces as they go towards the root portion connected to the base portion 21 along one side surface (the left side surface in the figure) of each of the large width portions 24.

Moreover, the second groove portions 46b in the small width portions 23 are formed so as to exhibit a pair of straight-line shapes parallel to the other side surface (the right side surface in the figure), whereas the second groove portions 46b in the large width portions 24 are formed so as to exhibit a shape such that they gradually widen towards both side surfaces as they go towards the root portion connected to the base portion 21 along the other side surface (the right side surface in the figure) of each of the large width portions 24.

Although in FIGS. 2A to 2C, both the first and second groove portions 46a and 46b have a larger groove width in the large width portions 24 than in the small width portions 23, the advantageous effects of the invention can be attained as long as at least one of the first and second groove portions 46a and 46b has a larger groove width than the small width portions 23.

By doing so, the width of each of bank portions 45 disposed between the inner walls of the first and second groove portions 46a and 46b of each resonating arm 22 disposed closer to both side surfaces of each resonating arm 22 and adjacent side surfaces thereof, is suppressed from widening near a root portion of the large width portion 24 attached to the base portion 21.

In this modification, the first and second groove portions 46a and 46b are formed so that the sum of a width t2 of the bank portion 45 and a width t2' of the bank portion 45' of the large width portion 24 of the resonating arm 22 shown in FIG. 2C is smaller than the sum of a width t1 of the bank portion 45 and a width t1' of the bank portion 45' of the small width portion 23.

On both side surfaces of the resonating arm 22, excitation electrodes 43 are arranged. Moreover, on the inner walls of the first and second groove portions 46a and 46b disposed close to both side surfaces, excitation electrodes 44 are provided as opposing electrodes of the excitation electrodes 43.

According to the piezoelectric resonator element 40 of the first modification, a heat conduction path for realizing heat conduction (heat transfer) by equalizing a temperature difference (temperature gradient) occurring between portions of the root portion of each resonating arm 22 attached to the base portion 21, the portions receiving compressive or tensile stress with the vibration of the resonating arm 22 become longer than the straight-line distance between the high temperature portion and the low temperature portion by being bypassed around the first and second groove portions 46a and 46b.

With this configuration, in the piezoelectric resonator element 40, a relaxation time τ required for equalizing the temperature difference through heat conduction increases, a relaxation vibration frequency $f_0$ that is inversely proportional to the relaxation time τ becomes distant from the flexural vibration frequency f, and a decrease in the Q value due to a thermoelastic loss is suppressed further.

Figure 3:
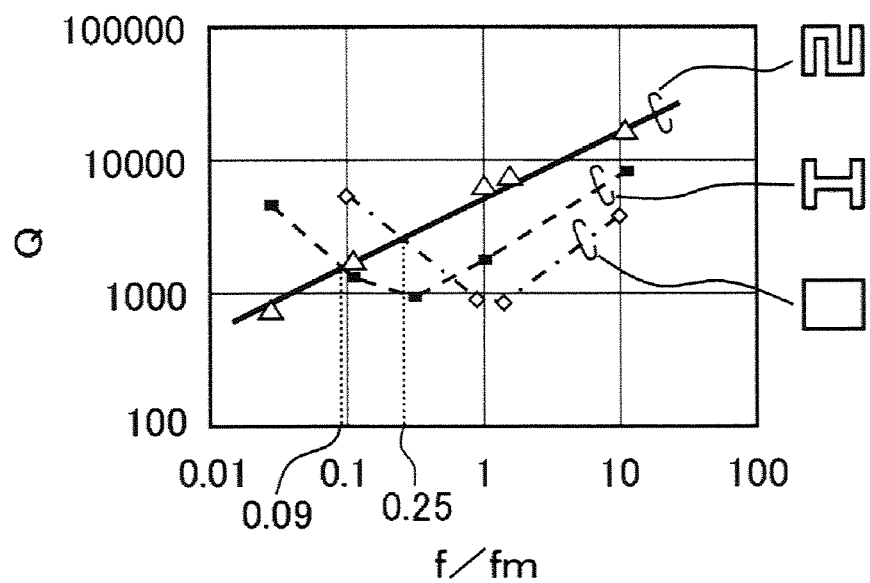
FIG. 3 is a graph showing f/fm dependence of the Q value of a flexural resonator element.

FIG. 3 is a graph showing f/fm dependence of the Q value of a flexural resonator element (quartz crystal resonator element). Here, fm is a relaxation vibration frequency when no groove portion (elongated groove) is provided to a flexural resonating portion (the resonating arm 22) (when the cross-sectional shape of the flexural resonating portion is approximately rectangular). The patterns on the right of the graph of FIG. 3 are schematic representations of the cross-sectional shapes of the flexural resonating portion.

In FIG. 3, triangular marks are plots for the cross-sectional shape of the resonating arm shown in FIGS. 2B and 2C, solid rectangular marks are plots for an H-type resonating arm shown in FIGS. 1B and 1C which has an H-shape in cross-sectional view, and empty diamond marks are plots for a flat plate-like resonating arm where no groove portion is provided in any principal surface of the resonating arm 22. Moreover, a bold solid line is an approximated straight line that connects the values of the triangular marks, a broken line is an interpolated straight line between the rectangular marks, and a one-dot chain line is an interpolated straight line between the diamond marks.

It can be understood from FIG. 3 that in a flexural resonator element, by forming the resonating arm 22 so as to have a cross-sectional shape as shown in FIGS. 2B and 2C so that f/fm has a value larger than 0.09, a higher Q value than in the case of the H-type resonating arm can be obtained.

Furthermore, in the flexural resonator element (corresponding to the piezoelectric resonator element 40), by setting the value of f/fm to be larger than 0.25, it is possible to obtain a Q value higher than in any of the H-type and flat-plate like resonating arms. Moreover, by setting the value of f/fm to be larger than 1, it is possible to obtain a Q value much higher than in any of the H-type and flat-plate like resonating arms.

Second Modification

The above embodiment has been described for the piezoelectric resonator element 20 having a configuration in which the bottomed elongated grooves 26a and 26b having the same shape each are formed on each of the first and second surfaces 22a and 22b (both principal surfaces) of each resonating arm 22. However, the invention is not limited to this, and a plurality of elongated grooves may be formed on at least one of both principal surfaces of the resonating arm.

Figure 4A:
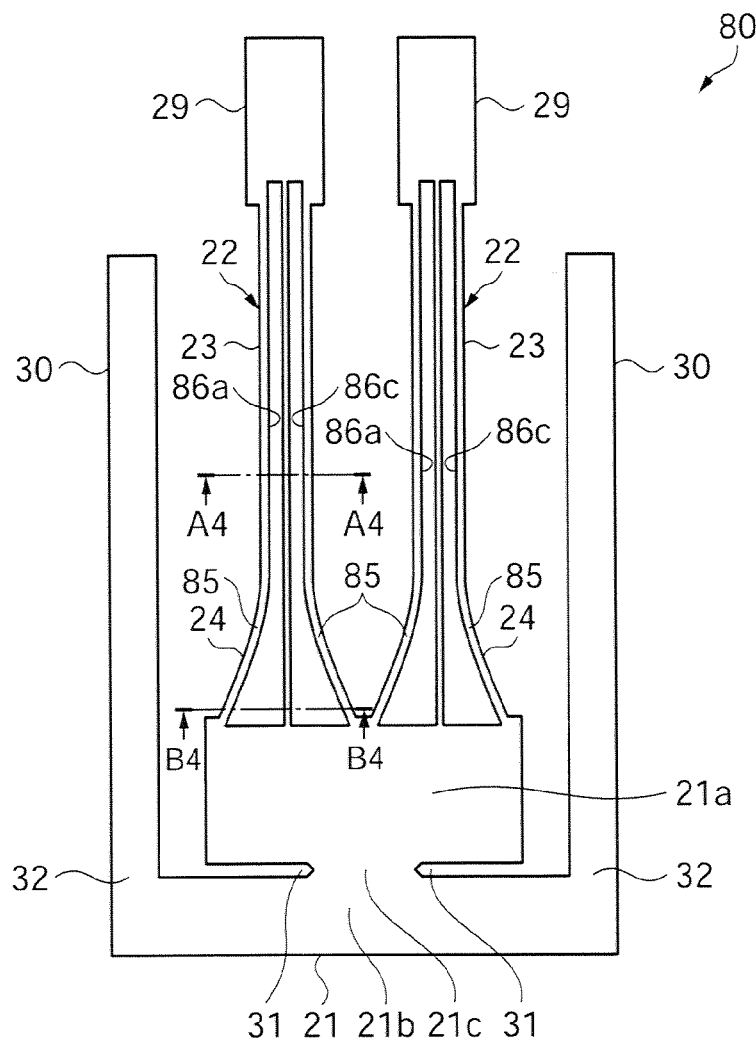
FIG. 4A is a plan view on one principal surface side, schematically illustrating a first example of a second modification of a piezoelectric resonator element.
Figure 4B:
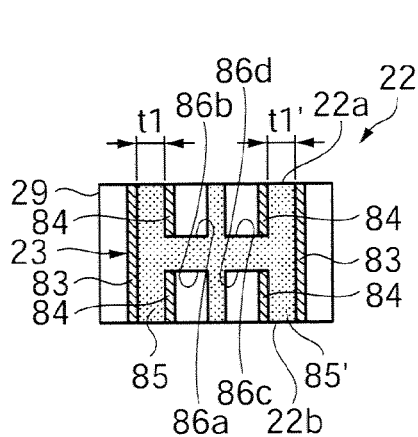
FIG. 4B is an enlarged sectional view taken along the line A4-A4 in FIG. 4A.
Figure 4C:
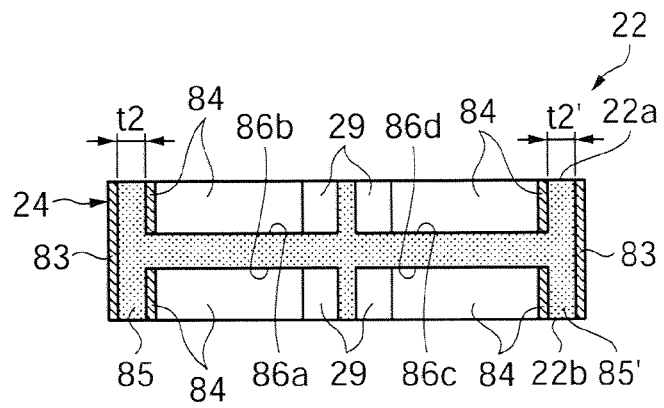
FIG. 4C is an enlarged sectional view taken along the line B4-B4 in FIG. 4A.
Figure 5A:
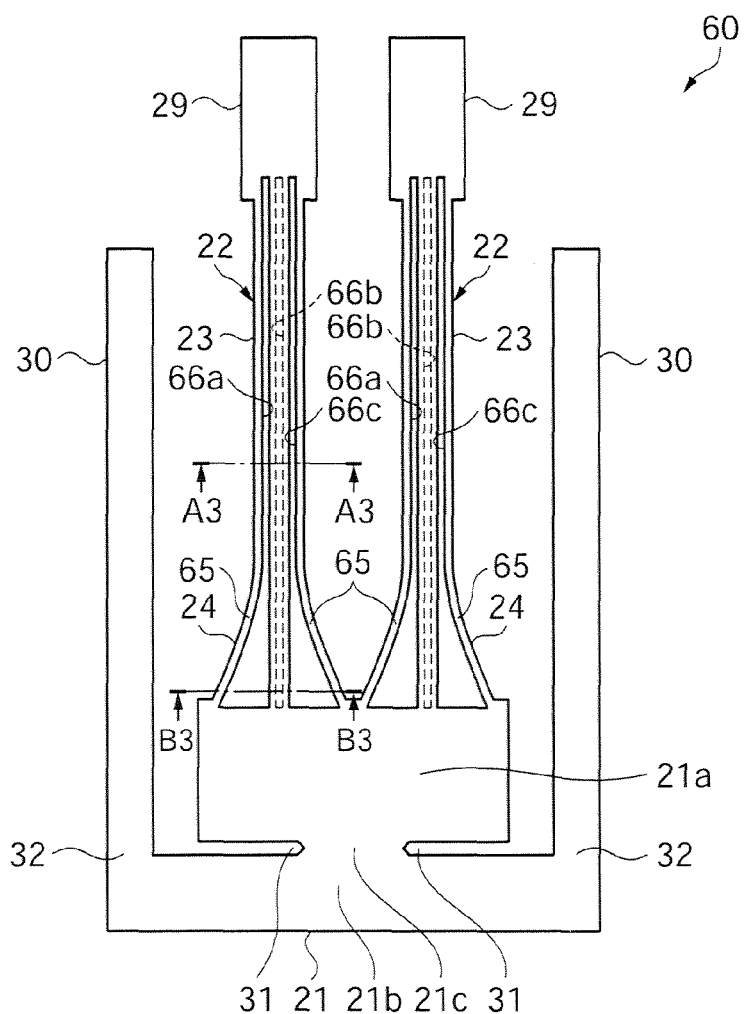
FIG. 5A is a plan view on one principal surface side, schematically illustrating a second example of the second modification of a piezoelectric resonator element.
Figures 5B, 5C:
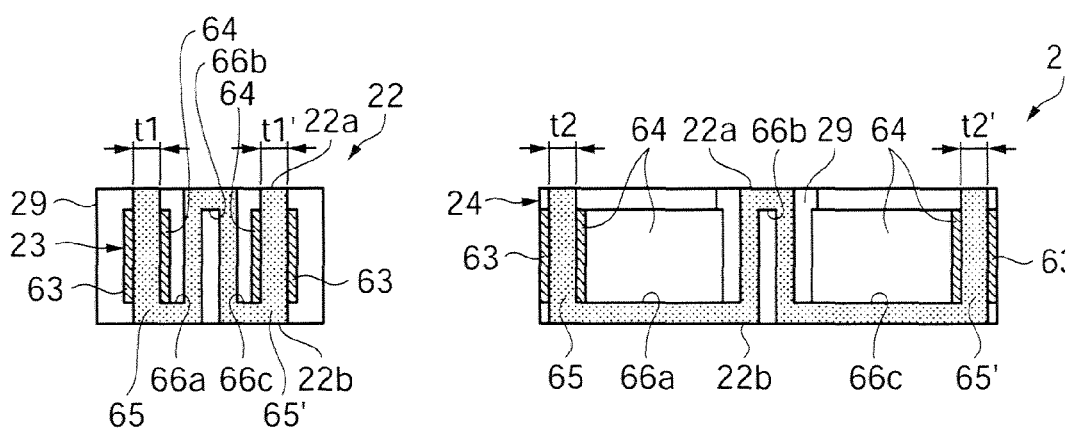
FIG. 5B is an enlarged sectional view taken along the line A3-A3 in FIG. 5A.
FIG. 5C is an enlarged sectional view taken along the line B3-B3 in FIG. 5A.

FIGS. 4A to 4C and FIGS. 5A to 5C schematically show modifications of a piezoelectric resonator element having a configuration in which a plurality of elongated grooves is formed on at least one of both principal surfaces (first and second surfaces) of a resonating arm. FIGS. 4A and 5A are plan views on one principal surface (first surface) side, FIGS. 4B and 5B are enlarged sectional views taken along the lines A3-A3 and A4-A4 in FIGS. 4A and 5A, respectively, and FIGS. 4C and 5C are enlarged sectional views taken along the lines B3-B3 and B4-B4 in FIGS. 4A and 5A, respectively. In this modification, in FIGS. 4A to 4C and FIGS. 5A to 5C, the same constituent elements as the above embodiment will be denoted by the same reference numerals, and description thereof will be omitted.

First, a first piezoelectric resonator element of the second modification will be described.

A piezoelectric resonator element 80 shown in FIG. 4A includes a base portion 21 having a pair of slits 31 formed therein, a pair of resonating arms 22 extending in parallel in a first direction from one end of a first portion 21a of the base portion 21, and a pair of supporting arms 30 extending from a second portion 21b of the base portion 21.

Each resonating arm 22 includes a small width portion (first width portion) 23 which is positioned at a central portion thereof, a large width portion (second width portion) 24 of which the width between both side surfaces of the resonating arm 22 increases gradually from the small width portion 23 to the base portion 21, and a weight portion 29 which is positioned at the distal end of each resonating arm 22 and has a width larger than the small width portion 23.

On the first surface 22a of each resonating arm 22 of the piezoelectric resonator element 80, a bottomed elongated groove (groove portion) 86a which is formed over an approximately half of the region in the longitudinal direction of each resonating arm 22 and a bottomed elongated groove (groove portion) 86c which is formed over a remaining approximately half of the region different from the region where the elongated groove 86a is formed are provided.

These elongated grooves 86a and 86c are formed so as to have a shape such that they extend along their respective adjacent side surfaces.

That is, elongated grooves 86a in the small width portions 23 are formed so as to exhibit a pair of straight-line shapes parallel to one side surface (the left side surface in the figure), whereas the elongated grooves 86a in the large width portions 24 are formed so as to exhibit a shape such that they gradually widen towards both side surfaces as they go towards the root portion connected to the base portion 21 along one side surface (the left side surface in the figure) of each of the large width portions 24.

Moreover, the other elongated grooves 86c in the small width portions 23 are formed so as to exhibit a pair of straight-line shapes parallel to the other side surface (the right side surface in the figure), whereas the elongated grooves 86c in the large width portions 24 are formed so as to exhibit a shape such that they gradually widen towards both side surfaces as they go towards the root portion connected to the base portion 21 along the other side surface (the right side surface in the figure) of each of the large width portions 24.

Furthermore, side walls at the center of each resonating arm 22 being adjacent to the elongated grooves 86a and 86c are formed so as to interpose straight-line shaped protruding portions that are parallel to the longitudinal direction of the resonating arm 22. That is, the elongated grooves 86a and 86c arranged in a line are provided in a symmetrical form with respect to an imaginary central line in the longitudinal direction of the first surface 22a of the resonating arm 22.

On the second surface 22b of each resonating arm 22, a bottomed elongated groove (groove portion) 86b which is formed over an approximately half of the region in the longitudinal direction of each resonating arm 22 and a bottomed elongated groove (groove portion) 86d which is formed over a remaining approximately half of the region different from the region where the elongated groove 86a is formed are provided.

These elongated grooves 86b and 86d provided on the second surface 22b have the same outer shape in plan view as the elongated grooves 86a and 86c provided on the first surface 22a, and the elongated grooves are arranged so as to overlap with each other.

In the piezoelectric resonator element 80, the width of each of bank portions 85 disposed between the inner walls of each of the elongated grooves 86a and 86c and the elongated grooves 86b and 86d of each resonating arm 22 disposed closer to both side surfaces of each resonating arm 22 and adjacent side surfaces thereof is suppressed from widening near a root portion of the large width portion 24 attached to the base portion 21.

In the piezoelectric resonator element 80, the elongated grooves 86a and 86c and the elongated grooves 86b and 86d are formed so that the sum of a width t2 of the bank portion 85 and a width t2' of the bank portion 85' of the large width portion 24 of the resonating arm 22 shown in FIG. 4C is smaller than the sum of a width t1 of the bank portion 85 and a width t1' of the bank portion 85' of the small width portion 23.

On both side surfaces of the resonating arm 22, excitation electrodes 83 are arranged. Moreover, on the inner walls of the elongated grooves 86a to 86d disposed close to both side surfaces, excitation electrodes 84 are provided as opposing electrodes of the excitation electrodes 83.

Next, a second piezoelectric resonator element of the second modification will be described.

A piezoelectric resonator element 60 shown in FIGS. 5A to 5C includes a pair of elongated grooves (first groove portions) 66a and 66c provided on a first surface 22a of each resonating arm 22 and an elongated groove (second groove portion) 66b provided in a region of a second surface 22b of each resonating arm 22 disposed between the elongated grooves 66a and 66c and not overlapping with the elongated grooves 66a and 66c in plan view.

More specifically, on the first surface 22a of each resonating arm 22, the bottomed elongated groove 66a which is formed in an approximately half of the region in the longitudinal direction of each resonating arm 22 and the bottomed elongated groove 66c which is formed in an approximately half of the region different from the region where the elongated groove 66a is formed are provided with a predetermined gap at the center in the longitudinal direction of the resonating arm 22.

Moreover, the elongated grooves 66a and 66c are formed so as to have a shape such that they extend along their respective adjacent side surface.

That is, elongated grooves 66a in the small width portions (first width portions) 23 are formed so as to exhibit a pair of straight-line shapes parallel to one side surface (the left side surface in the figure), whereas the elongated grooves 66a in the large width portions 24 are formed so as to exhibit a shape such that they gradually widen towards both side surfaces as they go towards the root portion connected to the base portion 21 along one side surface (the left side surface in the figure) of each of the large width portions (second width portions) 24.

The other elongated grooves 66c in the small width portions 23 are formed so as to exhibit a pair of straight-line shapes parallel to the other side surface (the right side surface in the figure), whereas the elongated grooves 66c in the large width portions 24 are formed so as to exhibit a shape such that they gradually widen towards both side surfaces as they go towards the root portion connected to the base portion 21 along the other side surface (the right side surface in the figure) of each of the large width portions 24.

Moreover, side walls at the center of each resonating arm 22 being adjacent to the elongated grooves 66a and 66c are formed so as to interpose straight-line shaped protruding portions that are parallel to the longitudinal direction of the resonating arm 22. That is, the elongated grooves 66a and 66c arranged in a line are provided in a symmetrical form with respect to an imaginary central line in the longitudinal direction of the first surface 22a of the resonating arm 22.

Furthermore, in the piezoelectric resonator element 60, the width of each of bank portions 65 disposed between the inner walls of each of the elongated grooves 66a and 66c of each resonating arm 22 disposed closer to both side surfaces of each resonating arm 22 and adjacent side surfaces thereof is suppressed from widening near a root portion of the large width portion 24 attached to the base portion 21.

In the piezoelectric resonator element 60, the elongated grooves 66a and 66c are formed so that the sum of a width t2 of the bank portion 65 and a width t2' of the bank portion 65' of the large width portion 24 of the resonating arm 22 shown in FIG. 5C is smaller than the sum of a width t1 of the bank portion 65 and a width t1' of the bank portion 65' of the small width portion 23.

Moreover, on the second surface 22b of each resonating arm 22, the straight-line shaped bottomed elongated groove 66b having side walls parallel to the side walls of the elongated grooves 66a and 66c disposed close to the central side is provided in an approximately central region in the longitudinal direction of the resonating arm 22 so as not to overlap with the elongated grooves 66a and 66c in plan view.

On both side surfaces of the resonating arm 22, excitation electrodes 63 are arranged. Moreover, on the inner walls of the elongated grooves 66a and 66c disposed close to both side surfaces, excitation electrodes 64 are provided as opposing electrodes of the excitation electrodes 63.

According to the second modification, in the piezoelectric resonator elements 80 and 60 in which the rigidity of the root portion of each resonating arm 22 attached to the base portion 21 is increased by the large width portion 24, the distance of a heat conduction path for equalizing a temperature difference occurring between portions which receive compressive or tensile stress with the vibration of the resonating arm 22 becomes longer than the straight-line distance between the high temperature portion and the low temperature portion by being bypassed around the elongated grooves 86a to 86d and the elongated grooves 66a to 66c.

With this configuration, in the piezoelectric resonator elements 80 and 60, since a relaxation time τ increases, a decrease in the Q value due to a thermoelastic loss is suppressed further.

In the piezoelectric resonator element 20 of the above-described embodiment, one elongated groove 26a is formed on the first surface 22a of the resonating arm 22 as above described the elongated grooves 26a and 26b of the piezoelectric resonator element 20, and one elongated groove 26b is provided on the second surface 22b. In contrast, in the piezoelectric resonator elements 80 and 60, a plurality of elongated grooves 86a and 86c (86b and 86d) or elongated grooves 66a and 66c are provided at least one of the first and second surfaces 22a and 22b, so that the bank portion is formed at the center of at least one of the first and second surfaces 22a and 22b of the resonating arm 22. Therefore, even when the width of each of the bank portions 85 and 65 on both side surfaces of each resonating arm 22 is small, it is possible to secure sufficient rigidity of the resonating arm 22.

Third Modification

The above embodiment and modifications have been described, as representative examples, for the piezoelectric resonator elements 20, 40, 60, and 80 having a configuration in which the pair of resonating arms 22 and the pair of supporting arms 30 extend from the base portion 21.

However, the invention is not limited to this, and the configuration near the root portion of the resonating arm of the resonator element attached to the base portion, which is a characteristic feature of the invention, namely the characteristic feature of the elongated groove shape in the large width portion of the resonating arm can provide the same advantageous effects in a resonator element having a different configuration from that described in the embodiment and modifications described above.

Figure 6:
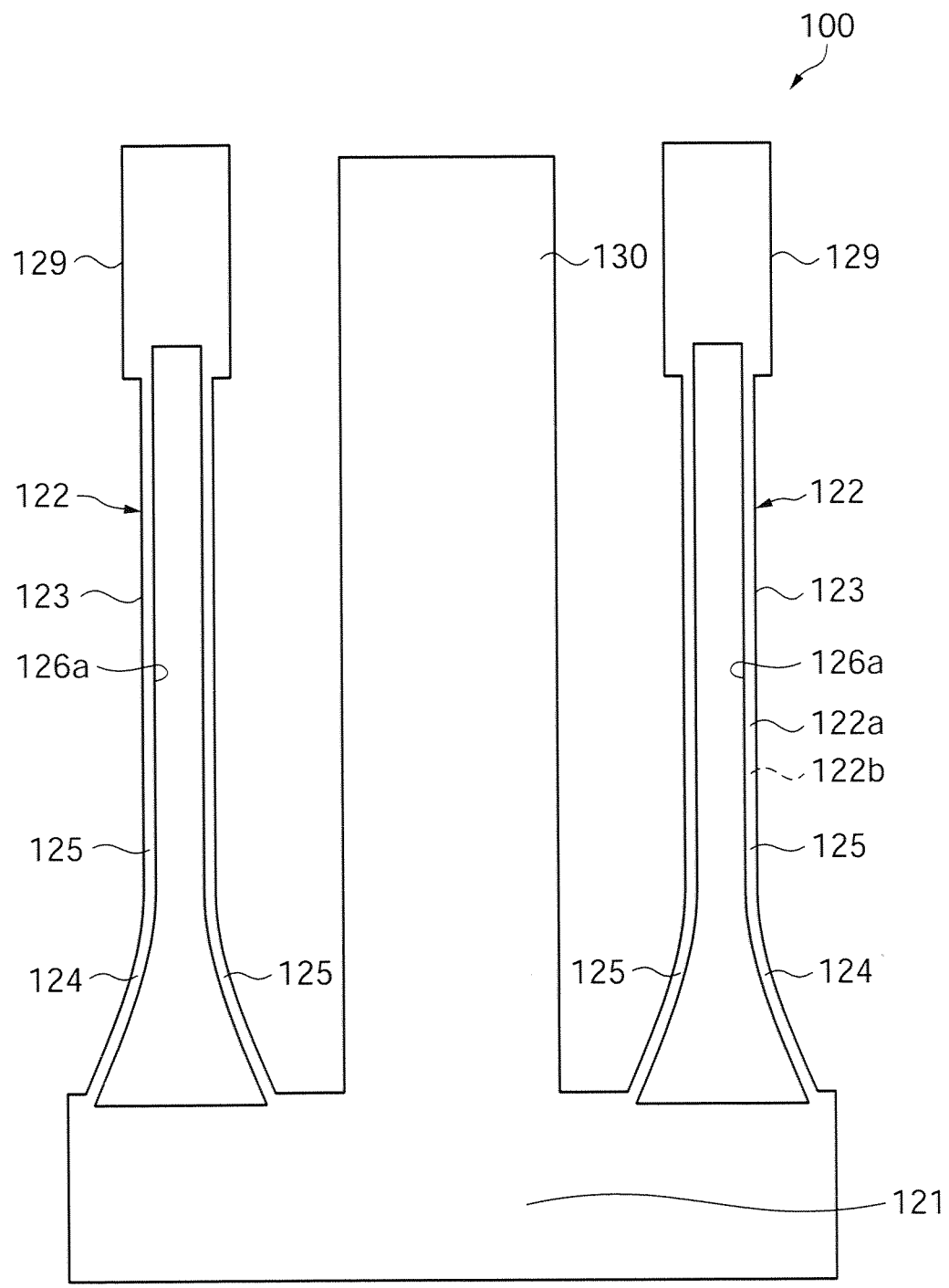
FIG. 6 is a plan view on one principal surface side, schematically illustrating a piezoelectric resonator element according to a third modification.

FIG. 6 is a plan view on one principal surface (first surface) side of a resonator element having a different configuration from that of the embodiment and modifications described above, schematically illustrating a modification to which the characteristic feature of the invention is applied. In this modification, the same constituent elements as the above embodiment will be denoted by the same reference numerals, and description thereof will be omitted.

A piezoelectric resonator element 100 shown in FIG. 6 includes a base portion 121 and a pair of resonating arms 122 arranged in a line (in parallel) and separated into two stages from one end (upper end in the figure) of the base portion 121 so as to extend in a first direction.

Moreover, a central supporting arm 130 used as a supporting arm arranged in parallel to each resonating arm 122 is provided so as to extend from a portion of the base portion 121 disposed between the pair of resonating arms 122.

The pair of resonating arms 122 extends in parallel to both principal surfaces (front and rear surfaces of the drawing sheet) from one end of the base portion 121. Moreover, each resonating arm 122 includes first and second surfaces 122a and 122b, which are both side surfaces, and both side surfaces that connect the first and second surfaces 122a and 122b at both sides.

Each resonating arm 122 includes a small width portion (first width portion) 123 which is positioned at a central portion thereof and which is a portion where a width of the resonating arm 122 between both side surfaces is relatively small. Moreover, each resonating arm 122 includes a large width portion (second width portion) 124 which is positioned in a root portion connected to the base portion 121, and of which the width between both side surfaces increases gradually from the small width portion 123 to the base portion 121 and becomes largest at the root portion attached to the base portion 121. Further, a weight portion 129 having a larger width than the small width portion 123 is formed at a distal end of each resonating arm 122.

A pair of bottomed elongated grooves (groove portions) 126a is formed on at least one of the first and second surfaces 122a and 122b of each resonating arm 122 so as to extend along the longitudinal direction of the resonating arm 122. In this modification, the elongated grooves 126a are provided so as to overlap with each other on the first and second surfaces 122a and 122b in plan view.

The elongated grooves 126a may be provided on only one side of the first and second surfaces 122a and 122b of each resonating arm 122.

In each resonating arm 122, the elongated grooves 126a in the small width portion 123 are formed so as to exhibit a pair of straight-line shapes parallel to both side surfaces whereas the elongated grooves 126a in the large width portion 124 are formed so as to exhibit a shape such that they gradually widen towards both side surfaces as they go towards the root portion connected to the base portion 121 along both side surfaces of the large width portion 124.

With this configuration, the piezoelectric resonator element 100 suppresses the width of each of the bank portions 125 disposed between the both inner walls of the elongated groove 126a of each resonating arm 122 and both side surfaces from widening near the root portion of the large width portions 124 attached to the base portion 121.

The central supporting arm 130 is positioned at an equal distance from each of the pairs of resonating arms 122 arranged on both sides thereof. The length of the central supporting arm 130 is not particularly limited and may be equal to and larger or smaller than the length of each of the pairs of resonating arms 122.

Moreover, the central supporting arm 130 is formed so as to have a larger mass than each of the pairs of resonating arms 122 that vibrate. Here, the mass of the central supporting arm 130 is preferably slightly larger than the mass of each resonating arm 122.

On the surfaces including the elongated grooves 126a of each resonating arm 122 and both side surfaces, excitation electrodes (not shown) are formed. When a voltage is applied between the excitation electrodes serving as opposing electrodes in each resonating arm 122 of the piezoelectric resonator element 100, both side surfaces of the resonating arm 122 are expanded and contracted, whereby the resonating arm 122 is vibrated.

Moreover, on at least one of the first and second surfaces 122a and 122b of the central supporting arm 130, mount electrodes are provided so as to be connected by the corresponding excitation electrodes and connection wirings (not shown).

The central supporting arm 130 is a portion that is attached to a package (not shown) or the like. For example, the central supporting arm 130 is attached and fixed to the connection pads of the package by a conductive adhesive or the like in a state where connection pads provided on the bottom portion of the package are aligned with respect to the corresponding mount electrodes. In this way, electrical connection between the package and the piezoelectric resonator element 100 can be realized.

Moreover, since the piezoelectric resonator element 100 has the central supporting arm 130 which is fixed to the connection pads of the package, the resonating arms 122 and the base portion 121 can suspend above the bottom portion of the package.

The piezoelectric resonator element 100 of the above-described third modification exhibits the thermoelastic loss suppressing effect provided by the characteristic shape of the elongated groove 26a (26b) in the large width portion 24 of the resonating arm 22 described in the embodiment and first and second modifications described above. In addition to this, in the third modification, the central supporting arm 130 arranged between the pair of resonating arms 122 exhibits the following advantageous effects.

That is, in the piezoelectric resonator element 100, since the central supporting arm 130 is provided between the pair of resonating arms 122, it is possible to suppress a change in operation parameters of the piezoelectric resonator element 100 caused by a disturbance of air between the resonating arms 122 when the respective resonating arms 122 vibrate, particularly when the respective resonating arms 122 vibrate in a direction close to each other.

Moreover, in the piezoelectric resonator element 100, it is possible to obviate various inconveniences which occur when the piezoelectric resonator element 100 is supported and fixed to a package or the like with the base portion 121 used as a supporting portion. For example, in the piezoelectric resonator element 100, the central supporting arm 130 can prevent the distal end of the resonating arm 122 from being inclined downward to make contact with a package or the like and obviate the occurrence of an abnormal operation or the like which can take place when an impact on a package is transmitted directly to each resonating arm 122.

Accordingly, the piezoelectric resonator element 100 can provide stable vibration properties.

Hereinabove, the embodiments of the invention made by inventors have been described in detail. However, the invention is not limited to the embodiments or modifications described above, but various changes can be made within a range without departing from the spirit thereof.

The embodiments and modifications described above have been described for the resonating arms 22 and 122 which have a continuous tapered shape and in which the large width portions 24 and 124 of which the width increases gradually from the small width portions 23 and 123 are connected to the base portions 21 and 121.

However, the invention is not limited to this, and for example, the piezoelectric resonator element may have a resonating arm in which a continuous tapered shape such that the width gradually increases from the small width portion close to the distal end of the resonating arm to the base portion is formed up to the vicinity of the root portion attached to the base portion, and a straight portion is provided along the extending direction of the resonating arm so as to extend from the vicinity to the root portion attached to the base portion toward the root portion attached to the base portion.

In this case, by providing the piezoelectric resonator element with an elongated groove having a shape following the outer shape (both side surfaces) of the resonating arm, no acute portion is present in the elongated groove near the root portion of the resonating arm attached to the base portion.

With this configuration, in the piezoelectric resonator element, when the elongated groove is formed by etching, for example, etching residues are decreased, and an elongated groove having a desired shape can be formed.

Moreover, in the above-described embodiment, the thermoelastic loss suppressing effect of the invention was described taking the piezoelectric resonator element 20 in the flexural vibration mode for example. However, the invention is not limited to this, and a piezoelectric resonator element that vibrates in a vibration mode other than the flexural vibration mode such as a twist vibration mode or a shear mode can provide the same advantageous effects as the embodiment and modifications described above as long as it has the characteristic configuration of the invention.

Furthermore, the embodiment and modifications of the invention have been described for the tuning-fork type piezoelectric resonator elements 20, 40, 60, 80, and 100 in which two resonating arms 22 and 122 are formed so as to extend in parallel from the base portions 21 and 121.

However, the invention is not limited to this, and a piezoelectric resonator element which is of a beam type where the piezoelectric resonator element has only one resonating arm having a base portion serving as a fixed end, or a type where the piezoelectric resonator element has three or more resonating arms can provide the same advantageous effects as the embodiment and modifications described above.

Furthermore, the embodiment and modifications of the invention have been described for the piezoelectric resonator elements 20, 40, 60, 80, and 100 which are formed of a piezoelectric material such as quartz crystal. However, the invention is not limited to this, and a resonator element which is formed, for example, of a silicon semiconductor can provide the same advantageous effects as the embodiment and modifications described above.

Resonator

Figure 7A:
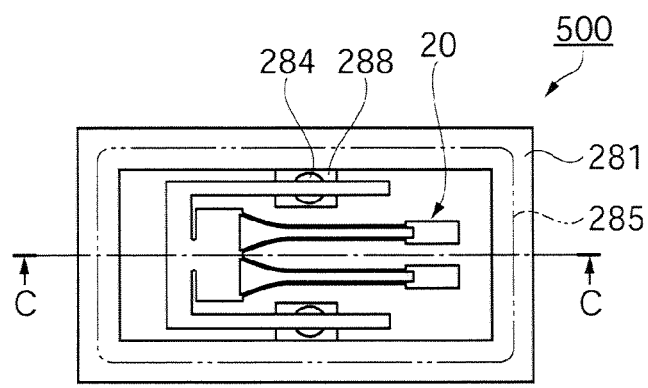
FIG. 7A is a schematic plan view showing a schematic configuration of a resonator.
Figure 7B:
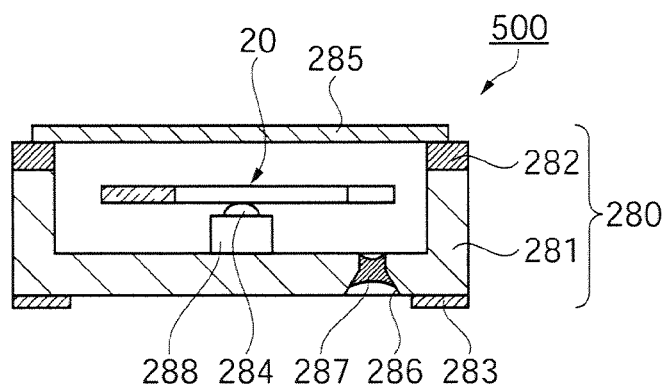
FIG. 7B is a sectional view taken along the line C-C in FIG. 7A.

FIGS. 7A and 7B are diagrams showing a schematic configuration of a resonator having the resonator element described in the embodiment and modifications described above, in which FIG. 7A is a plan view, and FIG. 7B is a sectional view taken along the line C-C in FIG. 7A.

As shown in FIGS. 7A and 7B, a resonator 500 is configured to include any one of the piezoelectric resonator elements 20, 40, 60, 80, and 100 serving as a resonator element (in this example, the piezoelectric resonator element 20 is used as an example) and a package 280 in which the piezoelectric resonator element 20 is accommodated.

The package 280 includes a package base 281, a shim ring 282, and a cover 285.

The package base 281 is formed with a recess portion so that the piezoelectric resonator element 20 can be accommodated therein, and connection pads 288 are provided in the recess portion so as to be connected to mount electrodes (not shown) of the piezoelectric resonator element 20.

The connection pads 288 are connected to wirings in the package base 218 and are electrically connected to an external connection terminal 283 which is provided on the outer circumference of the package base 281.

The shim ring 282 is provided on the circumference of the recess portion of the package base 281. Further, a penetration hole 286 is provided on the bottom portion of the package base 281.

The piezoelectric resonator element 20 is attached and fixed to the connection pads 288 of the package base 281 by a conductive adhesive 284. Thus, in the package 280, the cover 285 covering the recess portion of the package base 281 is shim-welded to the shim ring 282.

A sealant 287 made from a metallic material or the like is filled in the penetration hole 286 of the package base 281. The sealant 287 is solidified after being melted in a reduced pressure atmosphere, whereby the penetration hole 286 is airtightly sealed so that the inside of the package base 281 can be maintained in a reduced pressure state.

The resonator 500 oscillates (resonates) at a predetermined frequency (for example, 32 kHz) when the piezoelectric resonator element 20 is excited by a driving signal supplied from the outside through the external connection terminal 283.

As described above, since the resonator 500 includes the piezoelectric resonator element (20 or the like), it is possible to provide a resonator exhibiting the advantageous effects of the embodiment and modifications described above.

Oscillator

Figure 8A:
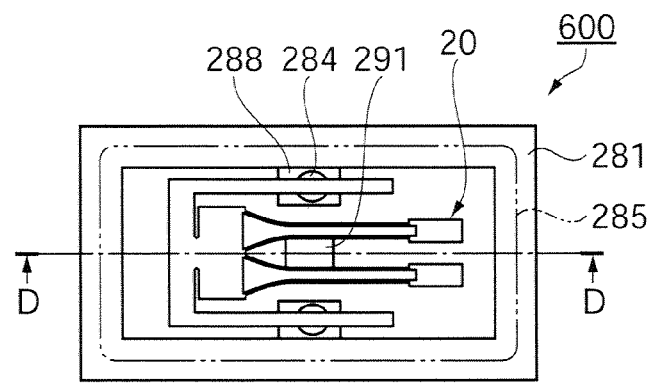
FIG. 8A is a schematic plan view showing a schematic configuration of an oscillator.
Figure 8B:
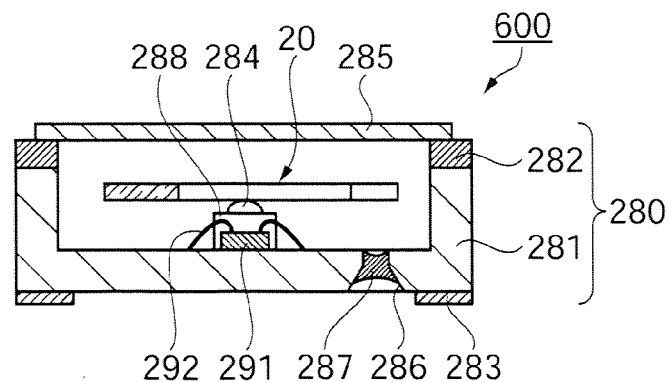
FIG. 8B is a sectional view taken along the line D-D in FIG. 8A.

FIGS. 8A and 8B are diagrams showing a schematic configuration of an oscillator having the resonator element described in the embodiment and modifications described above, in which FIG. 8A is a plan view, and FIG. 8B is a sectional view taken along the line D-D in FIG. 8A.

An oscillator 600 further includes an oscillation circuit in addition to the configuration of the resonator 500. Therefore, the portions common to the resonator 500 will be denoted by the same reference numerals, and detailed description thereof will be omitted.

As shown in FIGS. 8A and 8B, the oscillator 600 is configured to include any one of the piezoelectric resonator elements 20, 40, 60, 80, and 100 serving as a resonator element (in this example, the piezoelectric resonator element 20 is used as an example), an IC chip 291 serving as an oscillation circuit connected to the piezoelectric resonator element 20, and the package 280 in which the piezoelectric resonator element 20 and the IC chip 291 are accommodated.

The IC chip 291 is secured to the bottom portion of the package base 281 and connected to other wirings by metal wires 292 made from gold (Au), aluminum (Al), and the like.

The oscillator 600 oscillates (resonates) at a predetermined frequency (for example, 32 kHz) when the piezoelectric resonator element 20 is excited by a driving signal supplied from the IC chip 291.

As described above, since the oscillator 600 includes the piezoelectric resonator element (20 or the like), it is possible to provide a resonator exhibiting the advantageous effects of the embodiment and modifications described above.

It should be noted that the oscillator 600 may have a configuration (module structure) in which the IC chip 291 is attached to the outside of the package 280.

Electronic Device

Figure 9:
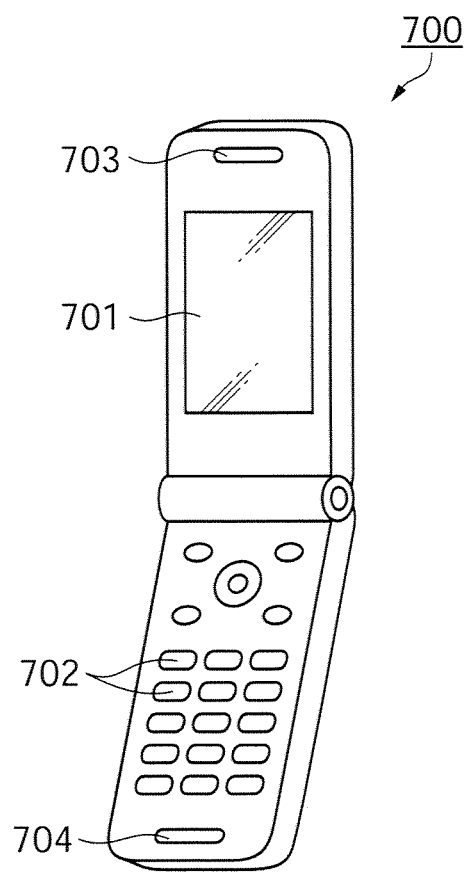
FIG. 9 is a schematic perspective view showing an example of an electronic device.
Figure 10:
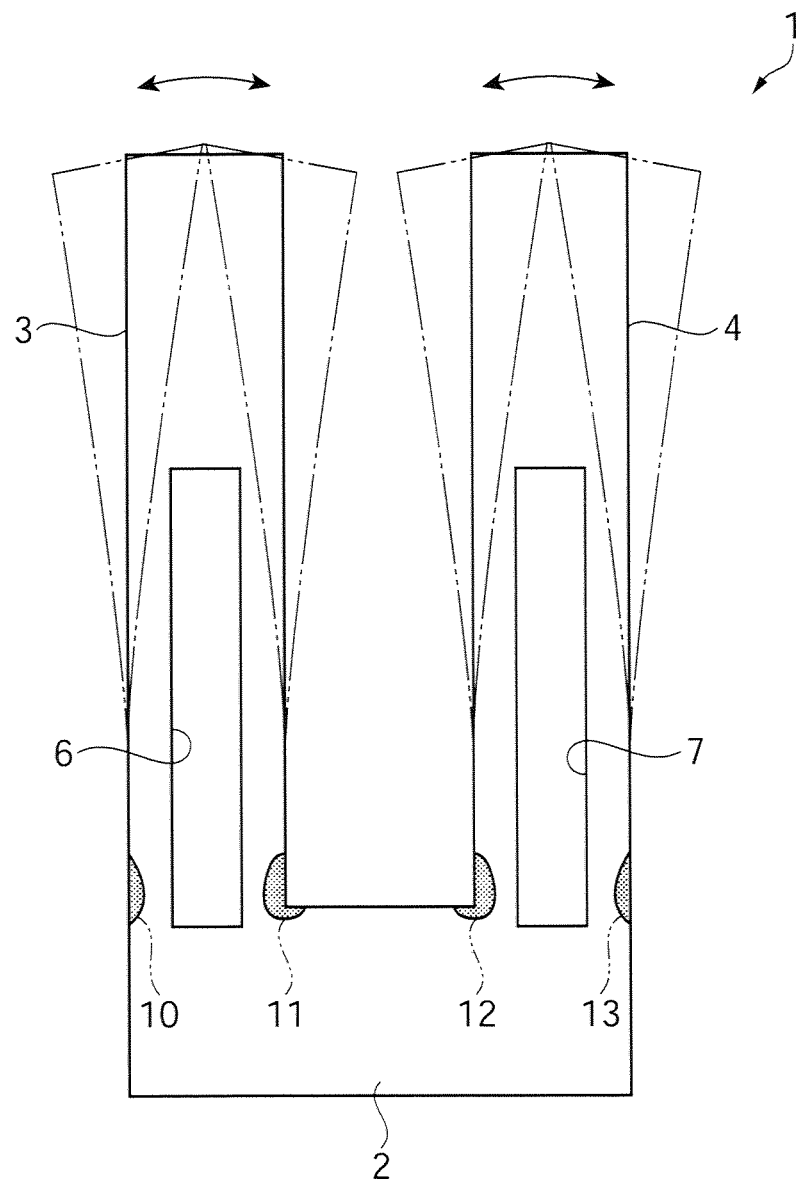
FIG. 10 is a plan view schematically showing a typical example of a piezoelectric resonator element according to the related art.

FIG. 9 is a schematic perspective view showing an example of an electronic device having the resonator element described in the embodiment and modifications described above.

A mobile phone 700 serving as an electronic device shown in FIG. 9 uses the above-described resonator element (any one of the piezoelectric resonator elements 20, 40, 60, 80, and 100) as a reference clock oscillation source, for example, and is configured to further include a liquid crystal display 701, a plurality of operation buttons 702, an ear piece 703, and a mouth piece 704.

The above-described resonator element (the piezoelectric resonator element 20 or the like) is not limited to the mobile phone but can be appropriately used as a reference clock oscillation source or the like of an electronic book, a personal computer, a television, a digital-still camera, a video camera, a video recorder, a car navigation apparatus, a pager, an electronic pocket book, an electronic calculator, a word processor, a work station, a television phone, a POS terminal, an apparatus having a touch panel, and the like. In any case, it is possible to provide an electronic device exhibiting the advantageous effects of the embodiment and modifications described above.

The entire disclosure of Japanese Patent Application No. 2009-210156, filed Sep. 11, 2009 and No. 2010-155488, filed Jul. 8, 2010 are expressly incorporated by reference herein.

What is claimed is:

1. A resonator element comprising:
a base portion; and
a resonating arm extending in a first direction from the base portion,
wherein the resonating arm includes a first surface, a second surface facing the first surface, a first side surface extending in the first direction so as to connect the first and second surfaces, and a second side surface facing the first side surface,
wherein the resonating arm includes a first width portion having a first width and a second width portion provided at a root of the resonating arm so as to have a second width larger than the first width,
wherein the resonating arm includes a groove portion provided on at least one of the first and second surfaces so as to extend in the first direction, the groove portion in the second width portion having a width larger than a width of the groove portion in the first width portion, and
wherein a sum of the width between the groove portion in the second width portion and the first side surface and the width between the groove portion in the second width portion and the second side surface is smaller than a sum of the width between the groove portion in the first width portion and the first side surface and the width between the groove portion in the first width portion and the second side surface.

2. The resonator element according to claim 1,
wherein a plurality of the groove portions is formed in at least one of the first and second surfaces.

3. A resonator element comprising:
a base portion; and
a resonating arm extending in a first direction from the base portion,
wherein the resonating arm includes a first surface, a second surface facing the first surface, a first side surface extending in the first direction so as to connect the first and second surfaces, and a second side surface facing the first side surface,
wherein the resonating arm includes a first width portion having a first width and a second width portion provided at a root of the resonating arm so as to have a second width larger than the first width,
wherein the resonating arm includes a first groove portion provided on the first surface and a second groove portion provided on the second surface, the first and second groove portions extending in the first direction,
wherein the first and second groove portions are arranged in a direction orthogonal to the first direction in a plan view from a normal direction to the first surface,
wherein a first depth of the first groove portion and a second depth of the second groove portion each are smaller than a distance in the normal direction between the first surface and the second surface, and a sum of the first and second depths is larger than the distance, and
a width of the first groove portion in the second width portion is larger than a width of the first groove portion in the first width portion, or a width of the second groove portion in the second width portion is larger than a width of the second groove portion in the first width portion.

4. The resonator element according to claim 3,
wherein the first groove portion is on the first side surface, and the second groove portion is on the second side surface, and
wherein a sum of the width between the first groove portion in the second width portion and the first side surface and the width between the second groove portion in the second width portion and the second side surface is smaller than a sum of the width between the first groove portion in the first width portion and the first side surface and the width between the second groove portion in the first width portion and the second side surface.

5. The resonator element according to claim 3, wherein a plurality of the first or second groove portions is formed in at least one of the first and second surfaces.

6. A resonator comprising:
the resonator element according to claim 1; and
a package accommodating the resonator element.

7. An oscillator comprising:
the resonator element according to claim 1; and
an oscillation circuit connected to the resonator element.

8. An electronic device in which the resonator element according to claim 1 is used.

* * * * *